(12) United States Patent
Yu et al.

(10) Patent No.: US 7,879,711 B2
(45) Date of Patent: Feb. 1, 2011

(54) STACKED STRUCTURES AND METHODS OF FABRICATING STACKED STRUCTURES

(75) Inventors: Chen-Hua Yu, Hsin-Chu (TW);
Wen-Chih Chiou, Miaoli (TW);
Weng-Jin Wu, Hsinchu (TW); Jean Wang, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 755 days.

(21) Appl. No.: 11/563,973

(22) Filed: Nov. 28, 2006

(65) Prior Publication Data

US 2008/0124845 A1 May 29, 2008

(51) Int. Cl.
*H01L 21/44* (2006.01)

(52) U.S. Cl. .......... 438/598; 438/455; 438/586; 438/618; 438/622; 438/926; 257/E23.145

(58) Field of Classification Search .......... 438/455, 438/586, 598, 618, 622, 926; 257/E23.145
See application file for complete search history.

(56) References Cited

U.S. PATENT DOCUMENTS

| 6,642,081 B1* | 11/2003 | Patti ........................ 438/109 |
| 6,897,125 B2 | 5/2005 | Morrow et al. |
| 2004/0232554 A1 | 11/2004 | Hirano et al. |
| 2007/0007595 A1* | 1/2007 | Hirano et al. ............. 257/347 |
| 2008/0020488 A1* | 1/2008 | Clevenger et al. .......... 438/3 |

FOREIGN PATENT DOCUMENTS

| TW | I234866 | 6/2005 |
| TW | I257144 | 6/2006 |

OTHER PUBLICATIONS

Official Action issued Sep. 13, 2010 in counterpart Taiwan Application.

* cited by examiner

*Primary Examiner*—Matthew Smith
*Assistant Examiner*—John M Parker
(74) *Attorney, Agent, or Firm*—Duane Morris LLP

(57) ABSTRACT

A method includes: forming a transistor gate over a first substrate and at least one first dummy structure within the first substrate; forming an interlayer dielectric (ILD) layer over the gate transistor, the ILD layer including at least one contact structure formed therein and making electrical contact with the transistor gate and at least one first conductive structure formed therethrough at least partially over a surface of the dummy structure; forming a passivation layer over the ILD layer, the passivation layer comprising at least one first pad structure formed therein and making electrical contact with the conductive structure; bonding the first substrate with a second substrate; removing at least a portion of the first dummy structure, thereby forming a first opening; and forming a conductive material within the first opening for formation of a second conductive structure, the second conductive structure being electrically coupled to the first conductive structure.

20 Claims, 22 Drawing Sheets

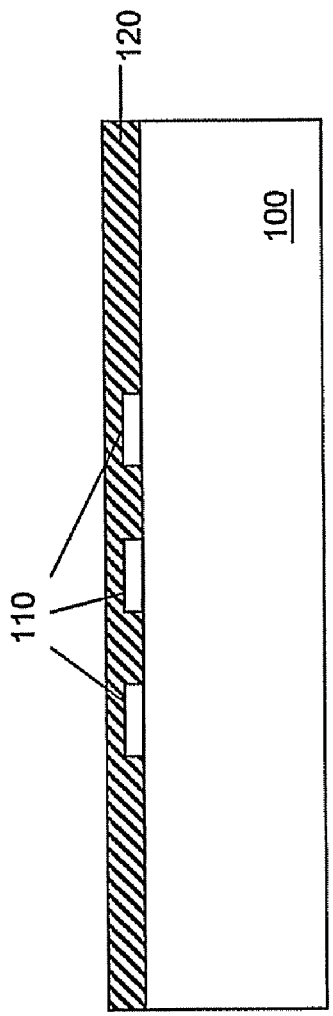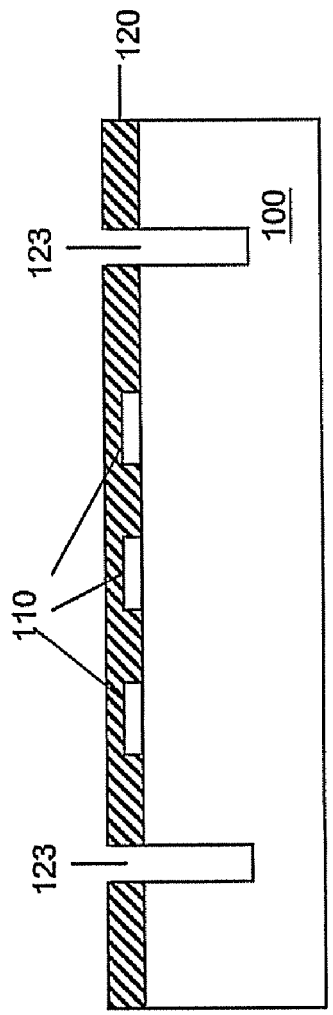
FIG. 1A (PRIOR ART)
FIG. 1B (PRIOR ART)

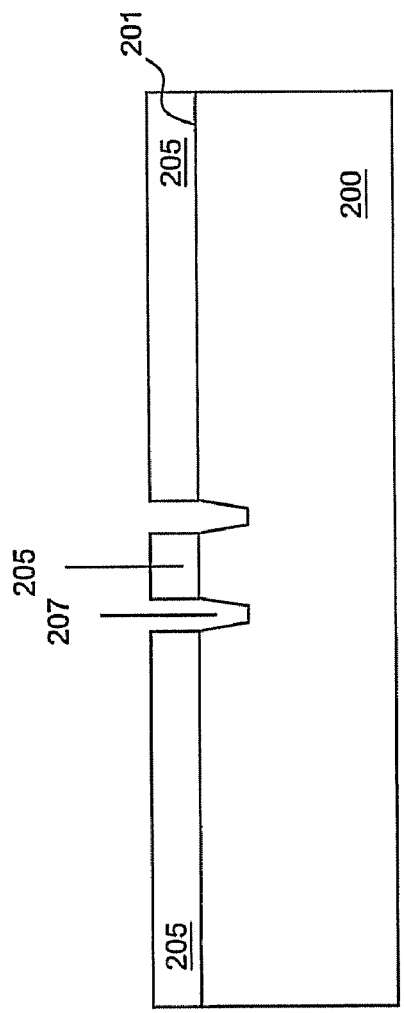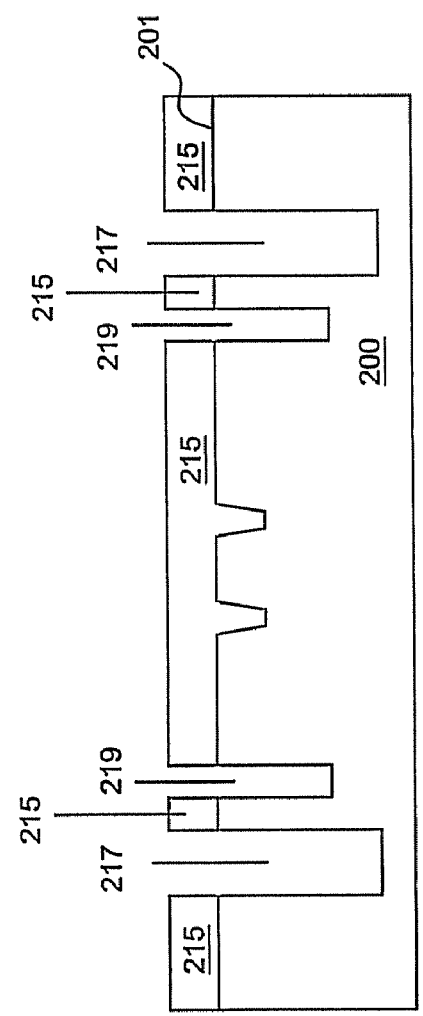
FIG. 2A
FIG. 2B

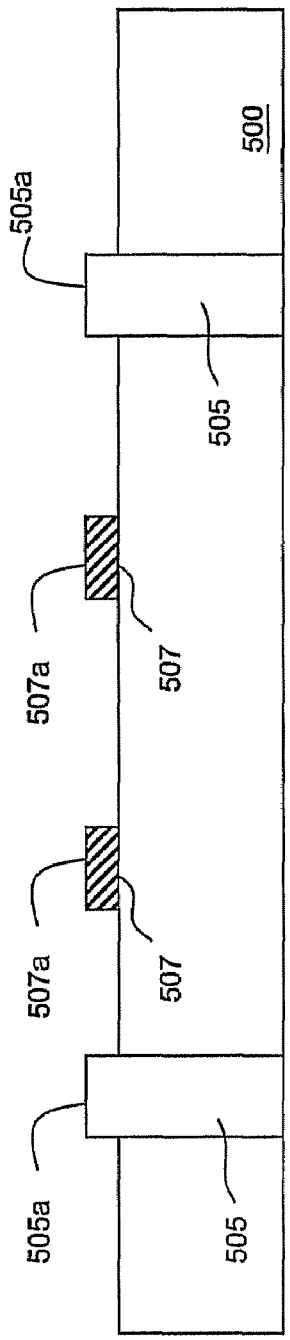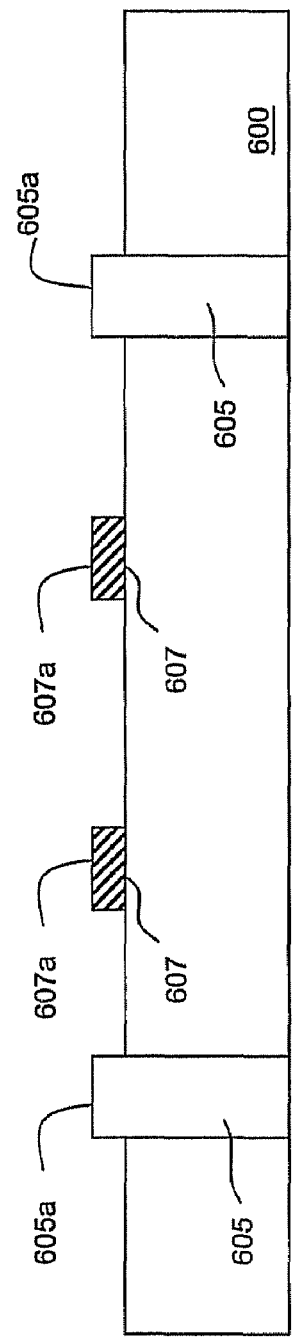

STACKED STRUCTURES AND METHODS OF FABRICATING STACKED STRUCTURES

BACKGROUND OF THE INVENTION

1. Field of the Invention

The present invention relates to semiconductor structures and methods of forming semiconductor structures, and more particularly to stacked structures and methods of fabricating stacked structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed goals, dimensions of semiconductor integrated circuits continue to shrink. Various materials and techniques have been proposed to achieve these integration and speed goals and to overcome manufacturing obstacles associated therewith. In order to achieve these goals, a stacked structure including multiple substrates has been proposed to enhance operational speed of circuits.

FIGS. 1A-1D are schematic cross-sectional views showing a process for formation of a prior art stacked structure.

As shown in FIG. 1A, active devices 110 are formed on a substrate 100. An interconnect structure 120 is formed over the substrate 100. The interconnect structure 120 comprises a number of levels of metallization (not shown), each layer of metallization separated from adjacent levels by a layer of dielectric material and interconnected with the adjacent levels by conductive vias.

As shown in FIG. 1B, openings 123 are formed through the interconnect structure 120 and within the substrate 100. After the formation of the openings 123, metal layers 125 are formed within the openings 123 formed in the interconnect structure 120 and the substrate 100, and conductive pad layers 130 are formed on the respective metal layers 125, as shown in FIG. 1C. The metal layers 125 and the pad layers 130 provide a path for electrical connection to the active devices 110 via the metallization layers (not shown) formed within the interconnect structure 120.

After the formation of the metal layers 125 and the pad layers 130, the substrate 100 is flipped and bonded to another substrate 100a by a thermal alloying process, as shown in FIG. 1D. The structures formed over the substrate 100a are similar to those formed over the substrate 100 and are identified with the suffix "a." The active devices 110 are electrically coupled to the active devices 110a via the interconnects of metal layers 125 and 125a and the pad layers 130 and 130a.

Referring again to FIG. 1B, in order to form the openings 123 provided for the formation of the metal layers 125 therein, an etch process is performed to remove portions of the levels of metallization within the interconnect structure 120 and then portions of the substrate 100. While removing portions of the substrate 100, the etch process exposes the surfaces of the openings 123, i.e., the substrate 100, to an environment containing metallic ions or other ions released from the exposed metal and dielectric layers (not shown) formed within the interconnect structure 120. The etch process can, therefore, contaminate the substrate 100. In addition, the etch process is complicated because multiple etch steps including varied etchants and processing conditions are used respective to different materials, such as different dielectric layers, low dielectric constant materials, substrate and/or even metal in some case. Accordingly, stacked structures and methods of forming stacked structures are desired.

SUMMARY OF THE INVENTION

In accordance with some exemplary embodiments, a method of forming a semiconductor device, comprising the steps of: (a) forming at least one transistor gate over a first substrate and at least one first dummy structure within the first substrate and at least one first conductive structure formed therethrough at least partially over a surface of the dummy structure; (b) forming an interlayer dielectric (ILD) layer over the gate transistor, the ILD layer comprising at least one contact structure formed therein and making electrical contact with the transistor gate; (c) forming a passivation layer over the ILD layer, the passivation layer comprising at least one first pad structure formed therein and making electrical contact with the conductive structure; (d) bonding the first substrate with a second substrate; (e) removing at least a portion of the first dummy structure, thereby forming a first opening; and (f) forming a conductive material within the first opening for formation of a second conductive structure, the second conductive structure being electrically coupled to the first conductive structure.

In accordance with some exemplary embodiments, a stacked structure comprises at least one first substrate and at least one second substrate. The first substrate comprises at least one first pad structure formed thereover. The second substrate comprises at least one transistor gate formed over the second substrate and at least one first conductive structure formed through the second substrate. The second substrate also comprises an interlayer dielectric (ILD) layer formed over the gate transistor. The ILD layer comprises at least one contact structure formed therein and making electrical contact with the transistor gate and at least one second conductive structure formed therethroguh at least partially over a surface of the first conductive structure, wherein the top surface of the first conductive structure is substantially planar with a top surface of the second substrate. The second substrate further comprises a passivation layer formed over the ILD layer. The passivation layer comprises at least one second pad structure making electrical contact with the second conductive structure, wherein the first substrate is coupled to the second substrate by bonding the first substrate with the second substrate.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 1A-1D are schematic cross-sectional views of a process for forming a prior art stacked structure.

FIGS. 2A-2K are schematic cross-sectional views of a process for formation of an exemplary stacked structure.

FIGS. 3A-3C are schematic cross-sectional views showing an exemplary method of forming an exemplary stacked structure.

DESCRIPTION OF THE PREFERRED EMBODIMENT

Figure 1C:
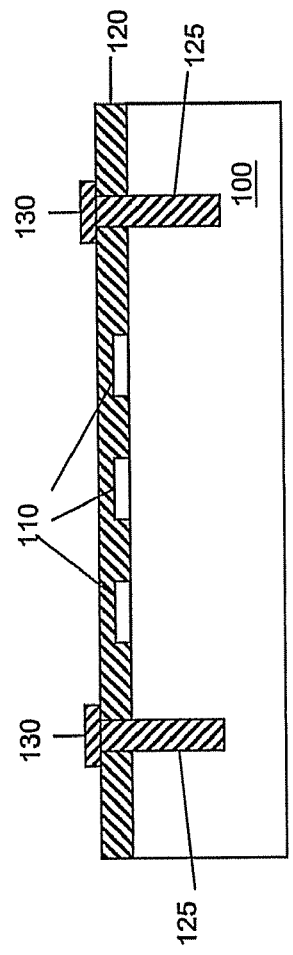
Figure 1D:
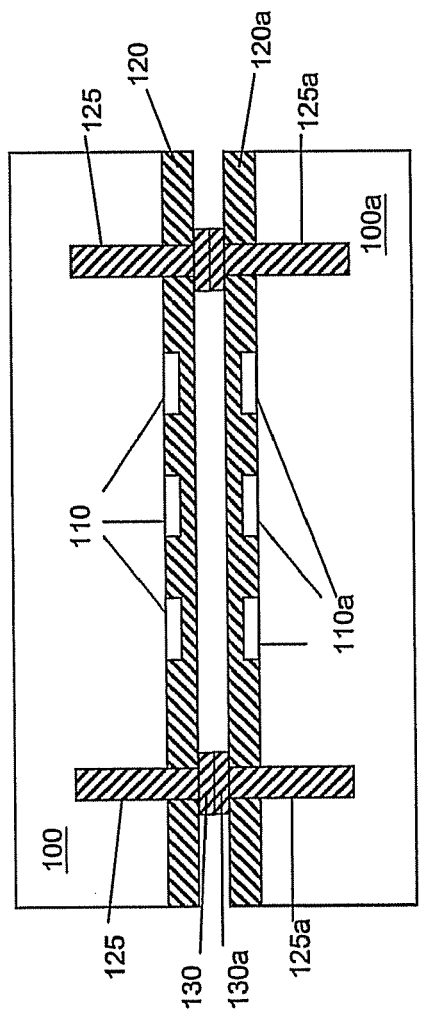

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2K are schematic cross-sectional views of a process for formation of an exemplary stacked structure.

Figure 2C:
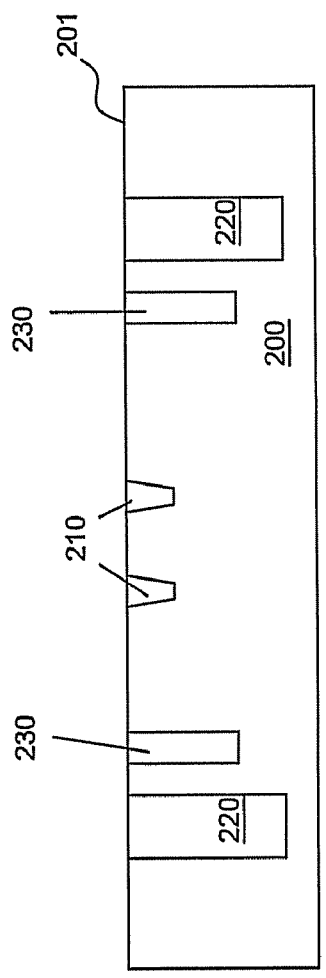

As shown in FIG. 2A, a patterned photoresist layer 205 is formed over a substrate 200. At least one opening, e.g., openings 207, is formed within the substrate 200 and through the photoresist layer 205. The openings 207 are provided for formation of isolation structures 210 (shown in FIG. 2C). The substrate 200 can be a silicon substrate, III-V compound substrate, display substrate such as a liquid crystal display (LCD), plasma display, cathode ray tube display or electro luminescence (EL) lamp display, or light emitting diode (LED) substrate (collectively referred to as, substrate 200), for example. The patterned photoresist layer 205 can be formed by a photolithographic process which partially exposes a top surface 201 of the substrate 200. An etch process then removes a portion of the substrate 200 to form the openings 207. After the formation of the openings 207, the patterned photoresist layer 205 is removed by, for example, a photoresist removal process.

As shown in FIG. 2B, a second patterned photoresist layer 215 is formed over the substrate 200. At least one opening, e.g., openings 219 and/or 217, is formed within the photoresist layer 215 and the substrate 200. The openings 217 and/or 219 can be, for example, a round hole, a square hole, a rectangular hole, an octangular hole, a trench opening or other shape of opening that is adapted to form a dummy structure. In some embodiments using 0.13-μm technology, the length×width of square openings 217 and/or 219 can be about 2 μm×2 μm, for example. In some embodiments, the depth of the opening 217 and 219 (from the top surface 201 of the substrate 200) can be about 30 μm or less, for example. It is submitted that the dimension and depth of the openings 217 or 219 may be correlated with the applied technology, i.e., the size and depth of the openings 217 and/or 219 reduce with reductions in feature sizes formed by the selected technology. The patterned photoresist layer 215 can be formed by a photolithographic process that partially exposes a top surface 201 of the substrate 200. An etch process then removes a portion of the substrate 200 to form the openings 217 and/or 219. After the formation of the openings 217 and/or 219, the patterned photoresist layer 215 is removed by, for example, a photoresist removal process.

In some embodiments, the openings 217 and 219 have the same depth, but different lengths and widths. In these embodiments, the openings 217 and 219 can be formed by the same photolithographic process and etch process. In other embodiments, the openings 217 and 219 have different depths. In these embodiments, formation of the openings 217 and 219 may utilize two photolithographic processes and two etch processes to respectively define the openings 217 and 219. The openings 217 and 219 are provided for forming conductive structures (not shown in FIG. 2B, but shown in FIG. 2I) for electrical connection and thermal dissipation, respectively. Detailed descriptions are provided below.

In some embodiments, the openings 217 and/or 219 can be formed prior to the formation of the openings 207 by changing the process sequence of FIGS. 2A and 2B. In other embodiments, the openings 217 and/or 219 are formed while an alignment mark (not shown) is formed within the substrate 200. In these embodiments, the reticle used for formation of the alignment mark includes predefined regions corresponding to the openings 217 and/or 219. Whether the predefined regions are transparent or opaque depends on the material property of used photoresist, such as positive photoresist and negative photoresist, respectively. However, if the desired depths of the openings 217 and 219 are different or their depths are different from the depth of the alignment mark, one or more additional photolithographic process and etch process described above are used.

As shown in FIG. 2C, at least one isolation structure, e.g., isolation structures 210, and at least one temporary dummy structure, e.g., dummy structures 220 and/or 230, are formed within the substrate 200. Specifically, after the removal of the patterned photoresist layer 215 (shown in FIG. 2B), a dielectric layer (not shown) is deposited or otherwise formed within the openings 207, 217 and 219. The dielectric layer can be, for example, an oxide, nitride, oxynitride, low-k dielectric material, extreme low-k dielectric material or other dielectric material. The dielectric layer can be formed by, for example, a chemical vapor deposition (CVD) process, a thermal process, a spin-coating process or other method that is adapted to form a layer of dielectric material. In some embodiments, the isolation structures 210 comprise shallow trench isolation (STI) structures which can be formed, for example, by a high density plasma chemical vapor deposition (HDP CVD) process. An etch-back process or chemical-mechanical planarization (CMP) process may be performed to remove portions of the dielectric layer formed over the top surface 201 of the substrate 200. In some embodiments, the dummy structures 220 and 230 are formed while the isolation structures 210 are formed. In other embodiments, two CVD processes are used to individually form the isolation structures 210 and the dummy structures 220 and/or 230. However, formation of the isolation structures 210 and the dummy structures 220 and/or 230 by the same process is preferred in order to reduce manufacturing costs, processing time and/or complexity.

Referring again to FIG. 2C, the top surface of the dummy structures 220 is substantially planar with the top surface 201 of the substrate 200. In some embodiments though, at least one dielectric layer (not shown), such as a pad oxide and/or pad nitride, is used for the formation of the isolation structures 210. In these embodiments, the top surface of the dummy structures 220 may higher than, but still proximate to, the top surface 201 of the substrate 200. In still other embodiments, the top surface of the dummy structures 220 may lower than, but still proximate to, the top surface 201 of the substrate 200 due to over-etch or over-polish from an etch-back process or CMP process, respectively.

After the formation of the isolation structures 210, at least one transistor comprising a transistor gate, e.g., a transistor gate 231 (shown in FIG. 2D) and source/drain regions (not shown), is formed over the substrate 200. The transistor is formed adjacent to the isolation structures 210. In some embodiments, a dielectric layer, such as an etch-stop layer (not shown), may be formed, covering the transistor gate 231 and/or source/drain regions of the transistor. The etch-stop layer is provided to protect the transistor gate 231 and/or source/drain regions of the transistor from being damaged by a subsequent contact hole etch process. The etch-stop layer can be, for example, an oxide layer, nitride layer, oxynitride layer or other dielectric material layer. In some embodiments, the etch-stop layer has a thickness between about 200 Å and about 500 Å. An interlayer dielectric (ILD) layer, e.g., the ILD layer 240, is then formed over the etch-stop layer to isolate the transistor gate 231 and/or source/drain regions (not shown) of the transistor from the first metal-containing layer of the interconnect structure (generally referred to as the "Metal-1" layer).

In some embodiments, the dummy structures 220 and/or 230 are formed before formation of the ILD layer 240. For example, after the formation of the etch-stop layer, the openings 217 and/or 219 (shown in FIG. 2B) are formed through the etch-stop layer and within the substrate 200. A dielectric layer (not shown) is then formed within the openings 217 and/or 219 to form the dummy structures 220 and/or 230, respectively. Because the openings 217 and/or 219 are filled with the dummy structures 220 and 230, respectively, before the formation of the ILD layer 240 and interconnect structures formed thereover, the top surfaces of the dummy structures 220 and 230 are substantially planar with the top surface of the etch-stop layer.

From the foregoing, because the openings 217 and/or 219 are filled with the dummy structures 220 and 230, respectively, before the formation of the ILD layer 240, the substrate 200, e.g., surfaces of the openings 217 and/or 219, are not subjected to contamination caused by metallic ions or other ions released from the ILD layer 240 when the ILD layer 240 is etched as described above. Further, the process for forming the dummy structures 220 and/or 230 requires only etching of the substrate 200 and a layer of dielectric material, if any.

Figure 2D:
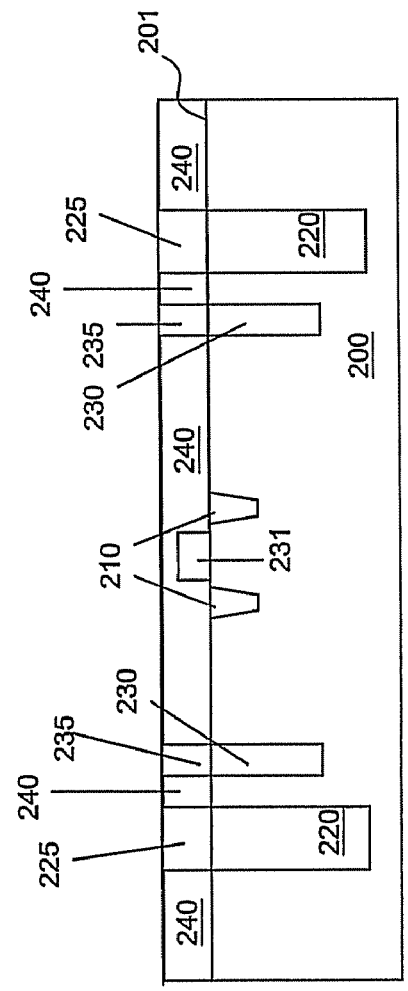

As shown in FIG. 2D, the ILD layer 240 is formed over the substrate 200, the isolation structures 210, the dummy structures 220 and/or 230 and the gate transistor 231. The ILD layer 240 includes at least one conductive structure, e.g., conductive structures 225 and 235, formed within and through the ILD layer 240. The conductive structures 225 and 235 at least partially cover the top surfaces of the dummy structures 220 and 230, respectively. The ILD layer 240 can be, for example, an oxide layer, nitride layer, oxynitride layer, extreme low-k (ELK) dielectric layer or low-k dielectric layer or other material that is adapted to isolate adjacent conductive layers. The ILD layer 240 can be formed by, for example, a CVD process, thermal process, spin-coating process or other process that is adapted to form a dielectric layer. During formation of the conductive structures 225 and/or 235, a contact structure (not shown), such as a contact, damascene or dual-damascene structure, is formed within the ILD layer 240 for making electrical contact with, for example, the transistor gate 231 and/or source/drain regions of the transistors. These contact structures are not shown so as to avoid unnecessarily obscuring the present disclosure.

Openings (not shown) provided for the formations of the conductive structures 225 and/or 235 are formed through a layer of dielectric material (provided for the formation of the ILD layer 240). The openings can be formed, for example, by a photolithographic process and an etch process to remove selected portions of the layer of dielectric material. Then, a layer of conductive material (not shown) is formed within the openings for the formation of the conductive structures 225 and/or 235. The conductive material can be, for example, tungsten (W), copper (Cu), aluminum (Al), AlCu, polysilicon or other conductive material. The layer of conductive material can be formed by, for example, a CVD process, physical vapor deposition (PVD) process, electrochemical plating process, electroless plating process or other process that is adapted to form a layer of conductive material. After the formation of the layer of conductive material, an etch-back process or CMP process may be performed to remove a portion of the layer of conductive material formed over the top surface of the ILD layer 240 so as to form the conductive structures 225 and 235. In some embodiments, different layers of conductive material are provided for individual formation of the conductive structures 225 and 235. However, the formation of the conductive structures 225 and 235 by the same layer of conductive material can reduce manufacturing costs, processing time and complexity.

In some embodiments, the conductive structures 225 and 235 can be a contact structure, damascene structure, dual damascene structure, round structure, square structure, rectangular structure, octangular structure, trench structure, array structure with a plurality of via/contact structures or other structure that at least partially covers the top surfaces of the dummy structures 220 and 230, respectively.

Figure 2E:
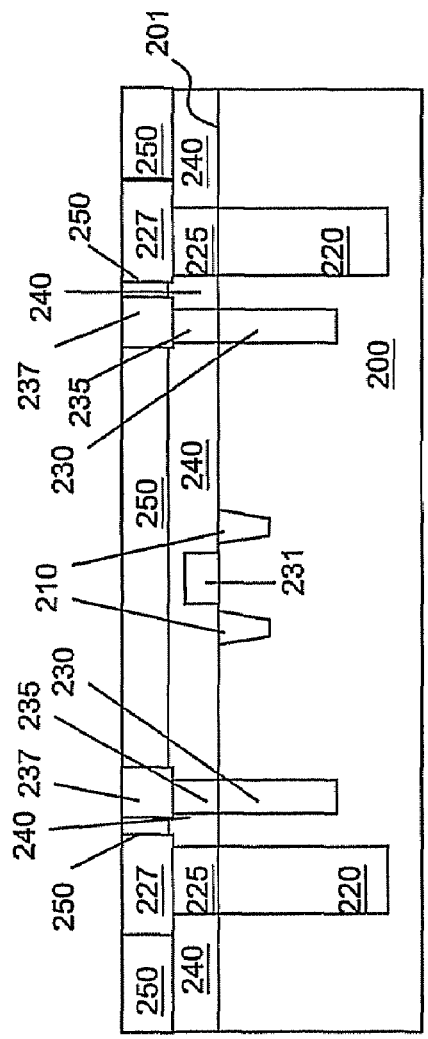

As shown in FIG. 2E, an inter-metal dielectric (IMD) layer 250 is then formed over the ILD layer 240. The IMD layer 250 includes at least one metal-containing layer, e.g., metal-containing layers 227 and 237, formed within or through the IMD layer 250. The metal-containing layers 227 and 237 substantially cover the top surfaces of the conductive structures 225 and 235, respectively, and make an electrical connection thereto. The IMD layer 250 can include a dielectric layer comprising, for example, an oxide layer, nitride layer, oxynitride layer, extreme low-k (ELK) dielectric layer or low-k dielectric layer or other material that is adapted to isolate adjacent conductive layers (not shown). The dielectric layer(s) of the IMD layer 250 can be formed by, for example, a CVD process, thermal process, spin-coating process or other process that is adapted to form a dielectric layer.

After formation of the structure shown in FIG. 2D, a layer of metal-containing material (not shown) is formed over the ILD layer 240. The layer of metal-containing material is then subjected to a photolithographic process and an etch process for the formation of the metal-containing layers 227 and 237. A layer of dielectric material (not shown) provided to form the IMD layer 250 is deposited over and between the metal-containing layers 227 and 237. A portion of the layer of dielectric material is then removed, such as by an etch-back process, for fully or partially exposing a top surface of the metal-containing layers 227 and 237. The metal-containing material can be, for example, tungsten (W), copper (Cu), aluminum (Al), AlCu or other conductive material. The layer of metal-containing material can be formed by, for example, a CVD process, physical vapor deposition (PVD) process, electrochemical plating process, electroless plating process or other process that is adapted to form a layer of conductive material. The formation of the metal-containing layer 227 and 237 from the same layer of metal-containing material and process is preferred, though not requested, so as to reduce manufacturing costs, processing time and manufacturing complexity.

Those in the art will recognize the IMD layer 250 as including one or more dielectric layers, each of which is formed between two metal-containing layers. Therefore, though not shown, during the formation of the metal-containing layer 227 and/or 237, metal-containing structures (not shown) are formed within the IMD layer 250, making electrical contact with the contact structures formed within the ILD layer 240 coupled to the gate transistor 231 and/or source/drain regions (not shown). Specific features of this electrical interconnect structure are not shown in the figures, though they are readily familiar to those in the art, so as to avoid unnecessarily obscuring the details of the improved stacked structure and methods of formation thereof described herein.

Those in the art will also understand that while only one IMD layer 250 is shown in the figures, multiple IMD layers can be provided, depending upon the selected technology, between the ILD layer 240 and the top metal-containing layer described below. For example, a structure formed by a 0.13-μm technology may include about 6 to 10 conductive metallization layers and associated dielectric layers. Such a structure can be formed by repeating the processes described above in connection with FIGS. 2D and/or 2E. By repeating the process, the dummy structures 220 and 230 are coupled to top metal layers formed over or within the IMD layer 250.

In some embodiments, the metal-containing layers 235 and 237 can be a via structure, damascene structure, dual damascene structure, round structure, square structure, rectangular structure, octangular structure, trench structure, array structure with a plurality of via/contact structures or other structure that at least partially covers the top surfaces of the conductive structures 225 and 227, respectively. In these embodiments, the metal-containing layers 227 and 237 are formed as any damascene or dual damascene techniques familiar to those in the art. Further, the number of the metallization layers is not limited to the one shown in the figures, the illustrations in the figures being exemplary. The number of the metallization layers may be correlated with the applied technology.

In some embodiments, the conductive structures, e.g. conductive structures 225 and 235, and the metal-containing layers, e.g. metal-containing layers 227 and 237, coupled to the dummy structures 220 and 230 are not formed until the step of the formation of the top metal-containing layer described above. For example, the interconnect structure coupled to the transistor gate 231 or source/drain regions of transistors (not shown) described above is formed by processes described in connection with FIGS. 2D and 2E. One or more photolithographic processes and etch processes are then employed to form openings (not shown) through the layers 240 and 250 to the dummy structures 220 and 230. The dummy structures 220 and 230 protect the substrate 200 from contamination during this process. The top metal-containing material is then formed within the openings, making contact with the dummy structures 220 and 230. Another photolithographic process and an etch process are then performed to define the patterns of the top metal-containing layers coupled to the dummy structures 220 and 230 as well as to the transistor gate 231 and/or source/drain regions. One of ordinary skill in the art will understand that the conductive structures 225 and/or 227 and the metal-containing layers 235 and/or 237 can be formed at different levels of the interconnect structure.

Figure 2F:
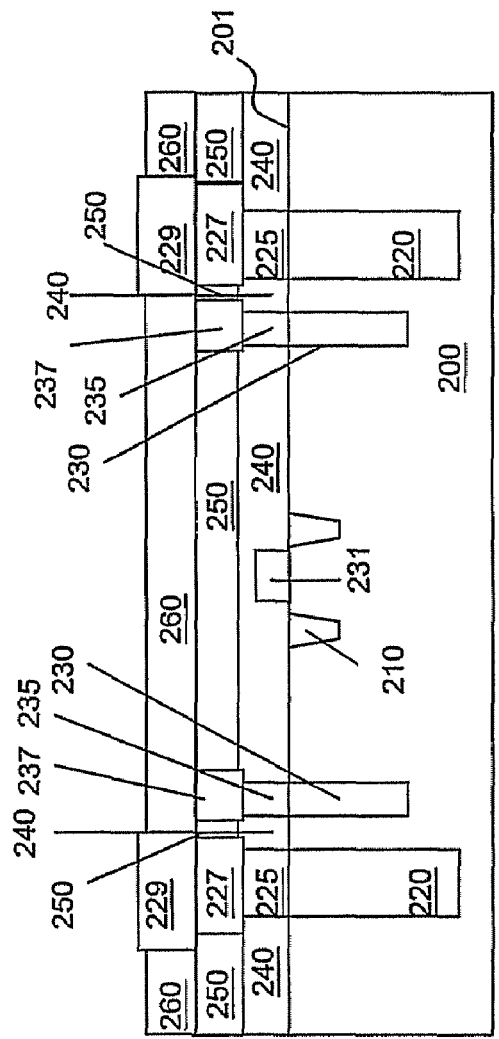

As shown in FIG. 2F, a passivation layer 260 is formed over the IMD layer 250. The passivation layer 260 includes at least one conductive pad structure, e.g., pad structures 229, formed within or through the passivation layer 260. The pad structures 229 preferably substantially cover the top surfaces of the metal-containing layers 227, making an electrical connection to the layers 227. The passivation layer 260 may comprise, for example, at least one polymer layer or dielectric layer (e.g., an oxide layer, nitride layer, oxynitride layer or combination thereof). The passivation layer 260 can be formed by, for example, a CVD process, thermal process, spin-coating process or other process that is adapted to form a dielectric layer. In this embodiment, an integrated circuit, such as including transistor including the transistor gate 231, formed on the substrate 200 is electrically coupled to the pad structure 229 via the metal-containing layers 227, conductive structures 225 and the interconnect structures (not shown in order to avoid obscuring the figures) formed within, for example, the layer 250.

The pad structure 229 can comprise, for example, a layer of tungsten (W), copper (Cu), aluminum (Al), AlCu, or other metal-containing material. The pad structure can be formed by, for example, a CVD process, physical vapor deposition (PVD) process, electrochemical plating process, electroless plating process or other process that is adapted to form a layer of metal-containing material.

Figure 2G:
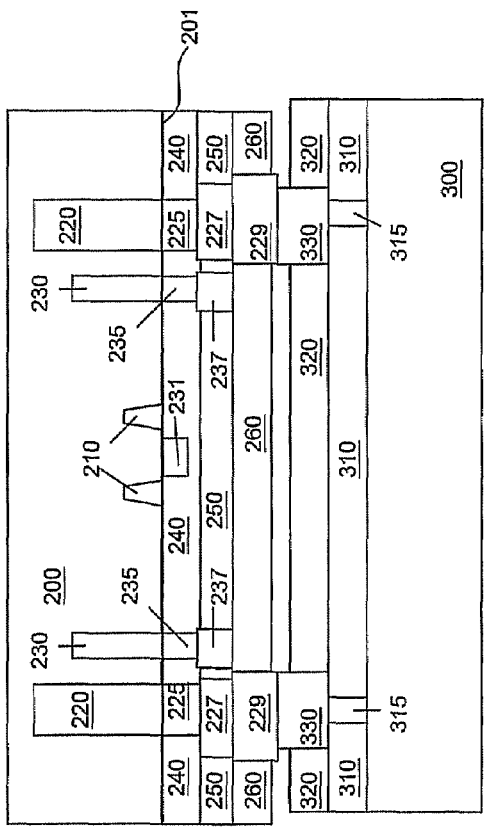

FIG. 2G shows that the substrate 200 is bonded with, and electrically coupled to, a second substrate 300. The substrate 200 can be bonded with the substrate 300 by, for example, a direct oxide bonding method, a direct metal bonding method or an adhesive bonding method as are familiar to those in the art. In some embodiments, the substrate 200 is coupled to the substrate 300 by attaching the pad structures 229 to pad structures 330 of the substrate 300. The substrate 300 includes at least one device or circuit (not shown) formed over and/or within the substrate 300. At least one dielectric layer, e.g., dielectric layer 310, is formed over the device or circuit. The dielectric layer 310 comprises at least one interconnect structure (not shown), such as, a via, contact or metal-containing layer, electrically coupled to the device or circuit. The dielectric layer 310 also comprises at least one conductive structure, e.g., conductive structures 315, formed therein and coupled to the interconnect structure. A passivation layer 320 is formed over the dielectric layer 310. At least one pad structure, e.g., pad structures 330, is formed within the passivation layer 320. The pad structures 330 substantially cover the top surfaces of the conductive structures 315 and make an electrical connection to the conductive structures 315. Accordingly, the device or circuit (not shown) formed over or within the substrate 300 is electrically coupled to the pad structures 330 via the conductive structures 315 and the interconnect structure (not shown) coupled thereto.

In some embodiments, the substrate 300, the dielectric layer 310, the conductive structures 315, the passivation layer 320 and the pad structures 330 are similar in material to the substrate 200, the ILD layer 240, the conductive structures 225, the passivation layer 260 and the pad structure 229, respectively. In still other embodiments, the structures formed over or within the substrate 300 are similar to those formed over or within the substrate 200.

The substrate 200 is flipped and attached to the substrate 300. A thermal process is performed for bonding the substrates 200 and 300. The thermal process includes, for example, the step of heating the combined structures at a process temperature between about 150° C. to about 500° C. for about 30 minutes under a vacuum environment or environment filled with nitrogen, inert gas or a mixture thereof. By bonding the substrates 200 and 300, devices and circuits (not shown) formed over or within the substrate 200 are electrically coupled to devices and circuits (not shown) formed over or within the substrate 300 via multi-level interconnect structures (not shown), the conductive structures 225 and 315, metal-containing layers 227 and pad structures 229 and 330 set forth above. In some embodiments, the substrate 300, rather than the substrate 200, is flipped and attached to the substrate 200 as long as the substrates 200 and 300 can be electrically coupled to each other.

In some embodiments, conductive bump structures (not shown) are formed between the pad structures 229 and 330. The bump structures can be formed over the pad structures 229 and/or 330, for example. The thermal process is then performed for bonding the pad structures 229 and 330 through the bump structures.

Figure 2H:
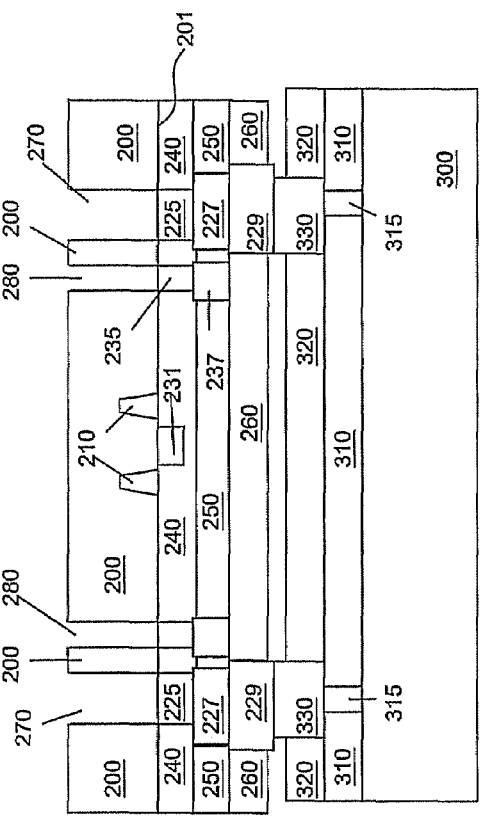

As shown in FIG. 2H, the backside of the substrate 200 is thinned and the dummy structures 220 and 230 are removed. After bonding the substrates 200 and 300, the bottom surface of the substrate 200 is subjected to a substrate thinning process, such as a grind process, a wet etch, a CMP process or a dry etch process. The substrate thinning process partially removes the backside of the substrate 200 and substantially exposes opposing surfaces of the dummy structures 220 and 230. A dry etch process or wet etch process is performed to remove the dummy structures 220 and 230 for forming openings 270 and 280, respectively. Though not necessarily required, it is preferred to bond the substrate 200 and 300 before forming openings 270, 280 and/or thinning the substrate 200 so as to ensure the substrate 200 is robust enough for handling during the bonding process.

In some embodiments, the dummy structures 220 and 230 are partially removed so that the openings 270 and 280 are formed but surrounded by the remaining portions of dummy structures 220 and 230, respectively. In other embodiments, at least one dummy structure 230 formed between two dummy structures 220 is not removed. The non-removed dummy structure 230 serves as an isolation structure and is provided to reduce or prevent electrical coupling between the conductive structures, e.g., conductive structures 275 and/or 285 (shown in FIG. 2I), formed within the openings 270 after the dummy structures 220 are removed. The partially removed dummy structures 220 and/or 230 can be formed by a photolithographic process and an etch process. Also, the dummy structure 230 for reducing or preventing electrical coupling between two conductive structures 275 and/or 285 can be preserved within the substrate 200 by covering the dummy structure 230 with a patterned photoresist layer.

In some embodiments, the dummy structures 220 and 230 are formed completely through the substrate 200. In these embodiments, the step of thinning the substrate 200 is not needed. However, forming dummy structures 220 and 230 completely through the substrate 200 increases the processing time, particularly when the substrate is hundreds-of-microns in thickness. This may not be a concern if the substrate 200 is only tens-of-microns in thickness.

Figure 2I:
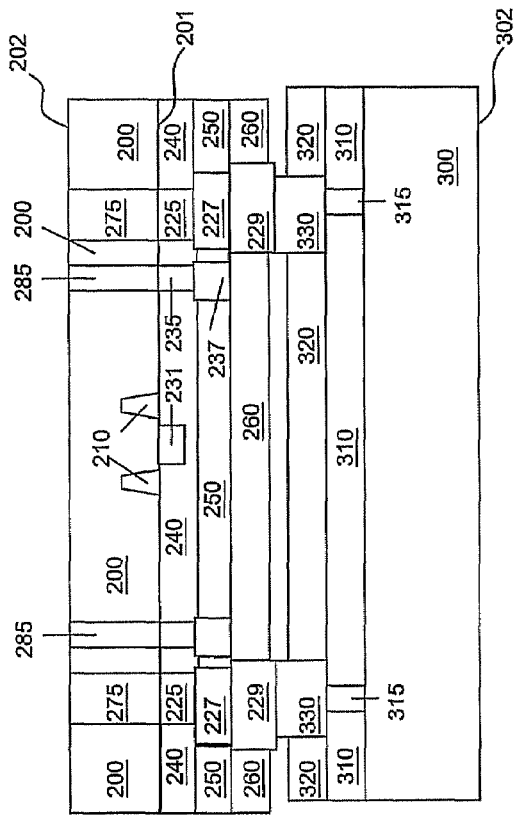

As shown in FIG. 2I, a conductive material is formed within the openings 270 and/or 280 to form conductive structures 275 and/or 285, respectively. The conductive material can be, for example, tungsten (W), copper (Cu), aluminum (Al), AlCu, polysilicon or other conductive material. The conductive material can be formed by, for example, a CVD process, physical vapor deposition (PVD) process, electrochemical plating process, electroless plating process or other process that is adapted to form a conductive material.

In some embodiments, the surface of the structure 275 most proximate to the conductive structure 225 is substantially coplanar with the surface 201 of the substrate 200. In other embodiments as described above in connection with FIG. 2D, an etch-stop layer (not shown) is formed, covering at least a portion of the surface of the substrate 200. In these embodiments, the surface of the structure 275 most proximate to the conductive structure 225 is substantially planar with the top surface of the etch-stop layer.

The conductive structures 275, conductive structures 225, the metal-containing layers 227, the pad structures 229 and 330 and the conductive structures 315 provide paths for electrical connection. The conductive structures 285, conductive structures 235 and metal-containing layers 237 provide thermal paths for dissipation of heat from a region in which circuits and devices (e.g., the transistor gate 231) and interconnect structures are formed over or within the substrate 200 to the bottom side surface 202 of the substrate 200. In some embodiments, the substrate 300 comprises structures similar to the conductive structures 285, conductive structures 235 and metal-containing layers 237 for thermal dissipation from circuits and devices (not shown) formed over or within the substrate 300 to the bottom side surface 302 of the substrate 300. In some embodiments, the conductive structures 285, conductive structures 235 and metal-containing layers 237 are not used if heat dissipation is not a concern.

As described above, in some embodiments, the dummy structures 220 and/or 230 are only partially removed so that the openings 270 and 280 are surrounded by the remaining dummy structures 220 and 230, respectively. In these embodiments, the conductive material formed within the openings 270 and 280 is surrounded by the remaining dummy structures 220 and 230. As set forth above, the material of the dummy structures 220 and 230 can be a dielectric layer. The remaining dielectric structures 220 and 230 surrounding the conductive structures 275 and 285, respectively, may reduce or prevent diffusion of metallic ions from the conductive structures 275 and 285 to the substrate 200. Further, the remaining portions of the dielectric structures 220 and 230 surrounding the conductive structures 275 and 285, respectively, serves as barrier layers to reduce or prevent the electrical coupling effect therebetween. In still other embodiments, the substrate 200 comprises at least one dielectric structure 230 which is not removed by the process shown in FIG. 2H. This dielectric structure 230 may be arranged between two conductive structures 275 and/or 285 for reducing or preventing electrical coupling therebetween.

In some embodiments, a dielectric liner (not shown) and/or a barrier layer (not shown) are formed on sidewalls of the openings 270 and 280. The dielectric liner can be, for example, an oxide layer, nitride layer, oxynitride layer, amorphous carbon layer, diamond-like carbon (DLC) layer, low-k dielectric layer, extreme low-k (ELK) dielectric layer or other dielectric layer. The barrier layer can be, for example, a layer of titanium (Ti), titanium nitride (TiN), tantalum (Ta), tantalum nitride (TaN), combination thereof or any other barrier material. The dielectric liner and the barrier layer may prevent or reduce diffusion of metallic ions from the conductive structures 275 and 285 to the substrate 200. In some embodiments, the dielectric liner may have a thickness between about 200 Å and about 800 Å along the sidewalls of the openings, and the barrier layer may have a thickness between about 200 Å and about 500 Å along the sidewalls of the openings. In other embodiments, the dielectric liner and the barrier layer are not used when the conductive structures 275 and 285 are surrounded by the remaining portions of the dummy structures 220 and 230.

Figure 2J:
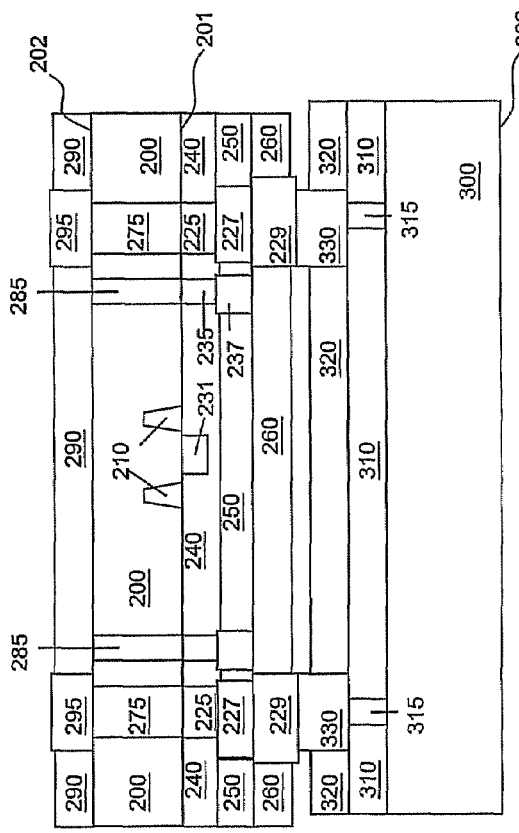

As shown in FIG. 2J, a passivation layer 290 is formed over the bottom surface 202 of the substrate 200. In some embodiments, pad structures 295 are formed within or through the passivation layer 290, substantially covering the surfaces of the conductive structures 275 and making electrical contact therewith. In some embodiments, the pad structures 295 and the passivation layer 290 are similar in material and structure to the pad structures 229 and the passivation layer 260, respectively. Accordingly, devices and circuits (not shown) formed over or within the substrates 200 and 300 can be electrically coupled to each other and/or to another substrate, such as a printed circuit board (PCB) or another substrate via the pad structures 295.

Figure 2K:
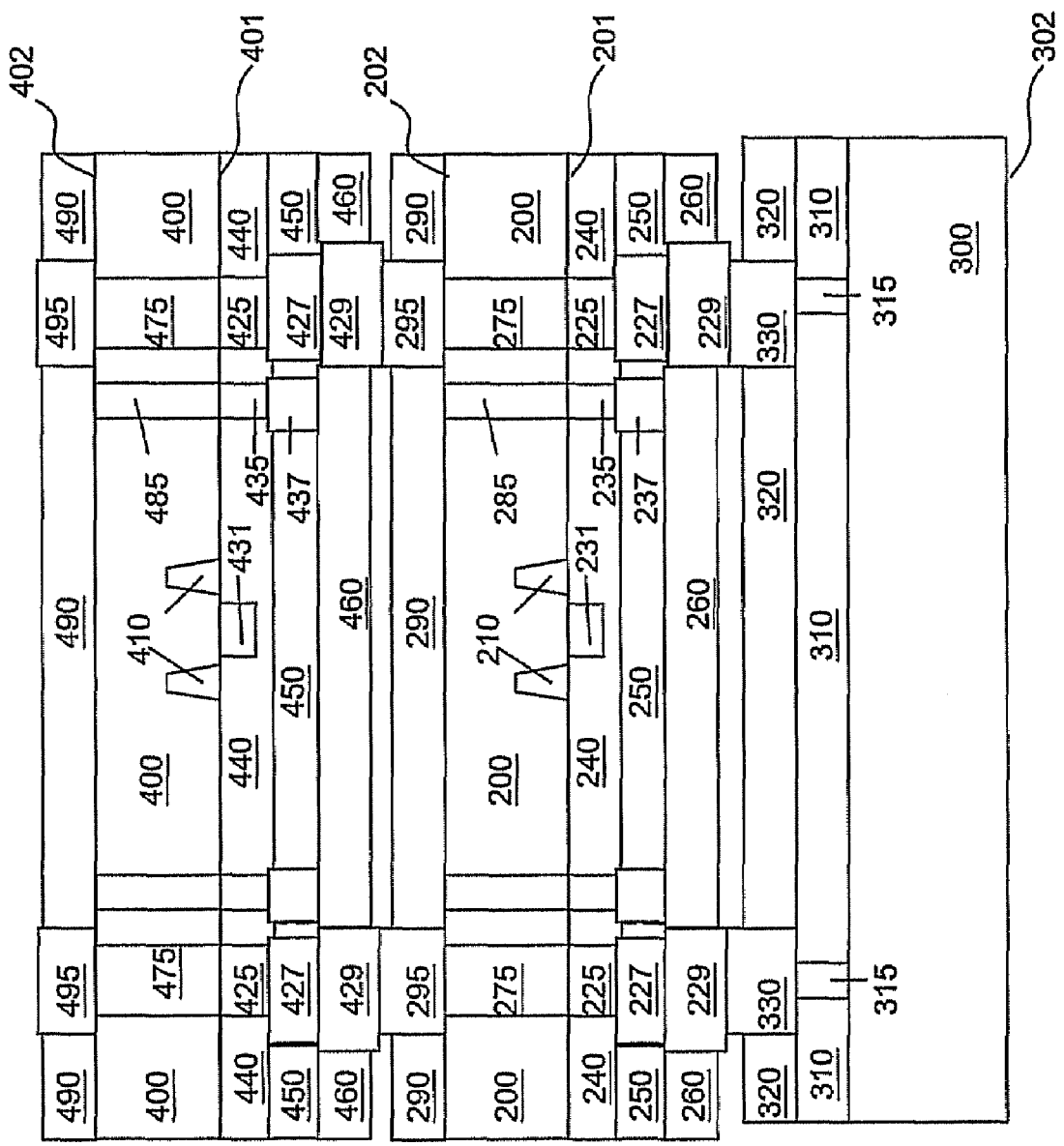

FIG. 2K shows a third substrate 400 electrically coupled to the stacked structure including the substrates 200 and 300 by attaching pad structures 429 to the pad structures 295. Items from the structures of the substrate 400 which are analogous to those from the structures of the substrate 200 are identified by reference numerals that are increased by 200.

A thermal process is performed to bond the substrates 200 and 400. The thermal process may be performed at a process temperature between about 150° C. to about 500° C. for process time of about 30 minutes under a vacuum environment or environment filled with nitrogen or inert gas. By bonding the substrates 200 and 400, devices and circuits (not shown) formed over or within the substrate 400 are electrically coupled to devices and circuits (not shown) formed within the stacked structure of the substrates 200 and 300 via the conductive structures 225, 275, 315, 425 and 475, metal-containing layers 227 and 427, the pad structures 229, 330, 295, 429 and 495 and interconnect structures (not shown) respectively formed and coupled to the corresponding devices and circuits formed over the substrates 200, 300 and 400.

Figure 3C:
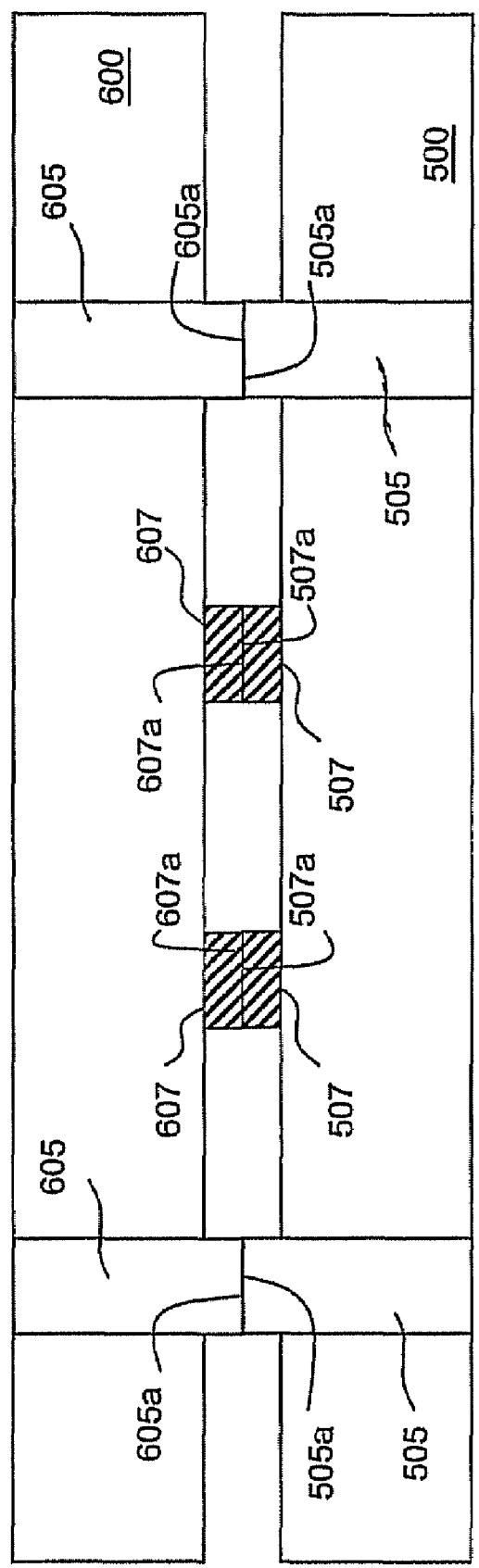

FIGS. 3A-3C are schematic cross-sectional views showing an exemplary method of forming an exemplary stacked structure.

Referring to FIG. 3A, a substrate 500 comprises at least one pad structure, e.g., pads 507, formed thereover and at least one support structure, e.g., support structures 505, formed therethrough. Each of the pads 507 has a surface 507a and each of the support structures 505 has a surface 505a. The surfaces 505a and 507a may be substantially coplanar in one exemplary embodiment. The substrate 500 can be the same as, or similar to, the substrate 200 set forth above in connection with FIG. 2A. In some embodiments, the structure shown in FIG. 3A may comprise a die generated by milling and sawing a wafer substrate (not shown).

In some embodiments, a variety of diodes, devices, transistors, circuits, or the like (not shown), or combinations thereof, are formed within and/or over the substrate 500. The pad structures 507 are formed over the substrate 500 and coupled to the diodes, devices, transistors, circuits or the like formed over the substrate 500. The pad structures 507 may comprise at least a layer of conductive material, such as Cu, Al, AlCu, Au, Pt, Pb, combination thereof or other suitable conductive material. The pad structures 507 can be formed by any suitable method known in the art, as long as the pad structures 507 can be electrically coupled to the diodes, devices, transistors, circuits or the like (not shown) formed over the substrate 500.

In some exemplary embodiments, the support structures 505 may be the same as, or similar to, the conductive structures 275 and pad structures 295 set forth above in connection with FIGS. 2I-2J. In other exemplary embodiments, the support structures 505 may comprise a dielectric structure, such as formed of oxide, nitride, oxynitride, or the like, or combinations thereof. In some exemplary embodiments, the support structures 505 can be formed by the method identical or similar to the method set forth above in connection with FIGS. 2A-2J.

Referring to FIG. 3B, the structure shown in this figure is similar to the structure shown in FIG. 3A. The substrate 600, pad structures 607 and support structures 605 are the same as, or similar to, the substrate 500, pad structure 507 and support structures 505, respectively. Detailed descriptions are not repeated.

Referring to FIG. 3C, the substrate 600 is flip bonded over the substrate 500. By the bonding step, the surfaces 505a, 507a contact the surfaces 605a, 607a, respectively. The bonding step may be the same as, or similar to, the bonding step set forth above in connection with FIG. 2G. The substrates 500 and/or 600 may include at least one low-k dielectric layer (not shown) formed therein and below the pad structures 507 and 607, respectively. The support structures 505 and 605 provide a desired mechanical support so that when the pad structures 507 and 607 are bonded together, the low-k dielectric layer may not be adversely affected or damaged due to its soft material characteristic. For embodiments using conductive support structures 505 and 605, the conductive support structures 505 and 605 may also provide electrical connection between diodes, devices, transistors, circuits or the like formed within or over the substrates 500 and 600.

The number, shape and/or disposition of the support structures 505 and 605 are not intended to be limited to the drawings shown in FIGS. 3A-3C. One of ordinary skill in the art can readily modify the exemplary embodiment to achieve other suitable mechanical supports for bonding the substrates 500 and 600. According to other exemplary embodiments, three or more substrates can be bonded in accordance with the exemplary methods and structures described above.

Figure 4A:
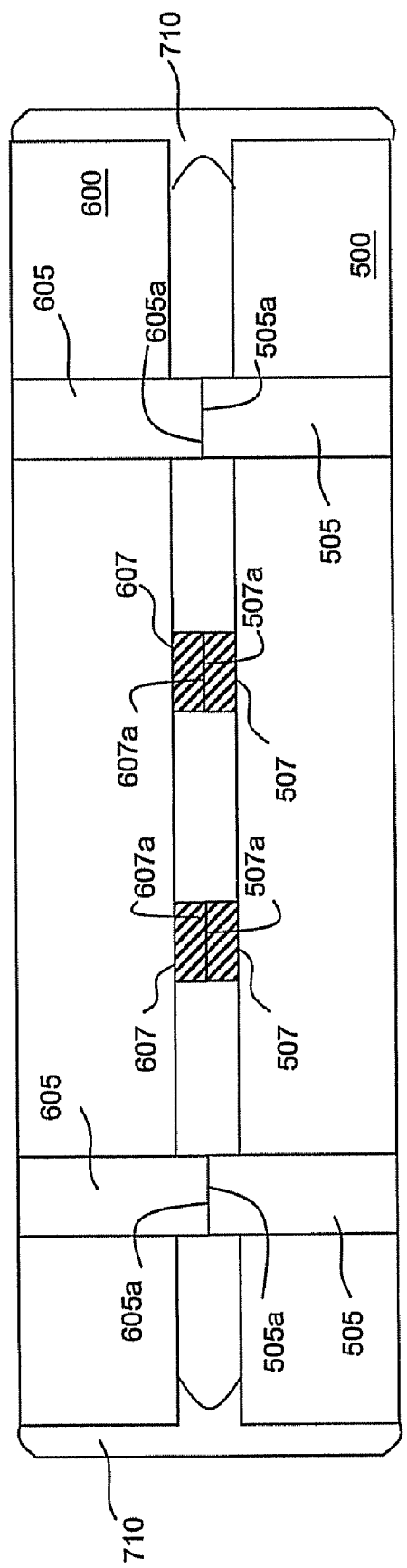
FIG. 4A is a schematic cross-sectional view showing an exemplary passivation structure formed around a stacked structure.

FIG. 4A is a schematic cross-sectional view showing an exemplary passivation structure formed around a stacked structure.

After the formation of the stacked structure as shown in FIG. 3C, a passivation structure 710 may be formed around the stacked structure as shown in FIG. 4A. The passivation structure 710 may comprise a dielectric layer, e.g., a layer formed of oxide, nitride, polyimide, oxynitride, and the like, or combinations thereof. The passivation structure 710 may be formed by suitable deposition processes such as a CVD processing step, spin-coating step, or the like, or combinations thereof. The passivation structure 710 is formed surrounding the edge of the stacked structure so that the bonded pads 507 and 607 are sealed by the substrates 500, 600 and the passivation structure 710. The passivation structure 710 prevents the bonded pads 507, 607 and diodes, devices, transistors, circuits and the like, formed within and/or over the substrates 500, 600 from being exposed to oxygen and moisture. Accordingly, the passivation structure 710 provides a desired protection to the bonded pads 507, 607 and diodes, devices, transistors, circuits and the like formed within and/or over the substrates 500, 600.

Figure 4B:
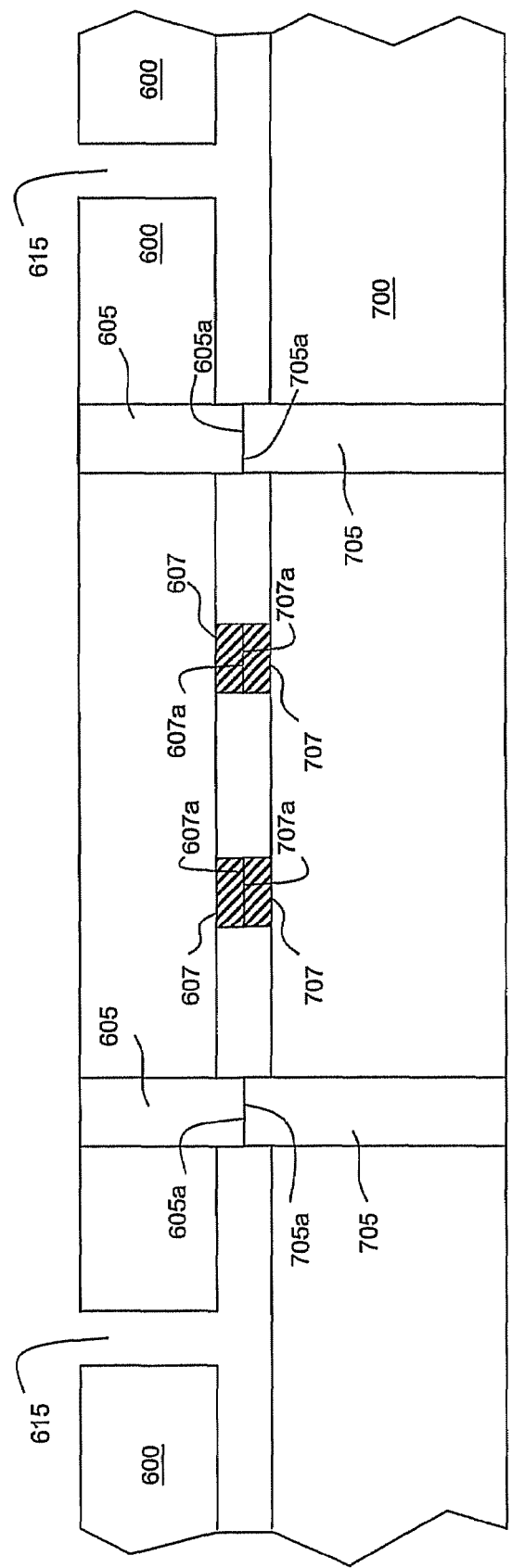
FIGS. 4B-4D are schematic cross-sectional views showing an exemplary method of forming another exemplary passivation structure around a stacked structure.
Figure 4C:
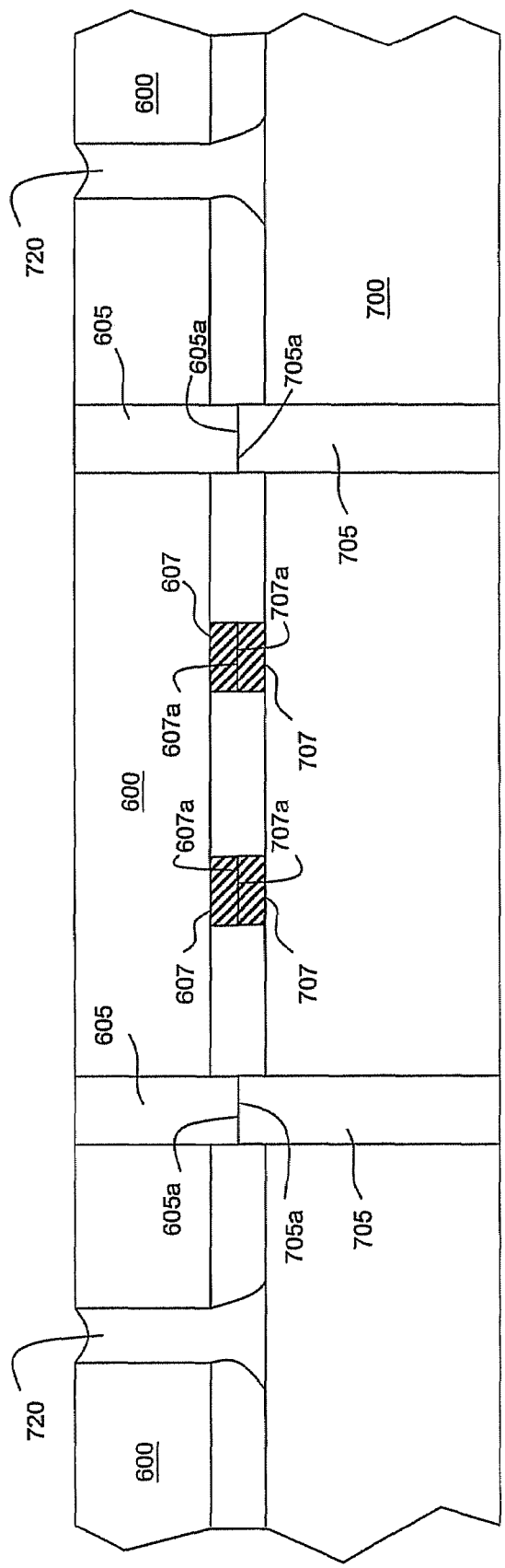
Figure 4D:
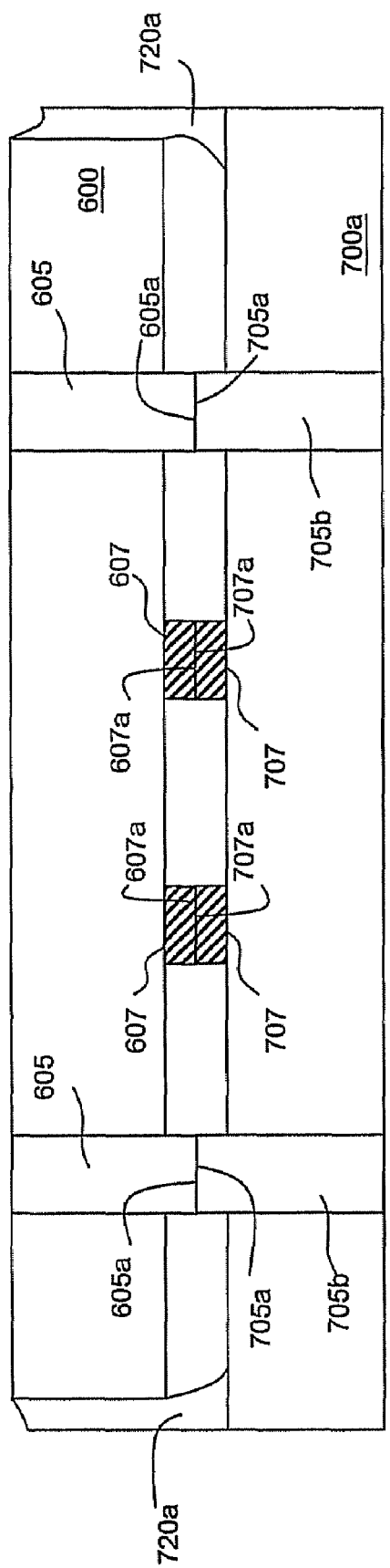

FIGS. 4B-4D are schematic cross-sectional views showing an exemplary method of forming another exemplary passivation structure around a stacked structure.

Referring to FIG. 4B, a substrate 700 comprises pad structures 707 and support structures 705. The substrate 700 is similar to the substrate 500 set forth above in connection with FIG. 3A, except that the substrate 700 has not been subjected to a backside milling step and a die sawing step and may include a plurality of substrates 600 disposed thereover. The pad structures 707 are similar to the pad structures 507. The support structures 705 are similar to the support structures 505 except that the support structures 705 have not been subjected to a backside milling step.

A plurality of the substrates 600 are flip bonded over the substrate 700. The bonding step may be the same as, or similar to, that described above in connection with FIG. 2G. After the bonding step, gaps 615 are formed between adjacent substrates 600.

Referring to FIG. 4C, passivation structures 720 are formed in the gaps 615. The material of the passivation structures 720 may be similar to those of the passivation structure 710 described above. The methods of forming the passivation structures 720 may be similar to those set forth above in connection with FIG. 4A.

Referring to FIG. 4D, the structure shown in FIG. 4C is subjected to a backside milling step and a sawing step, thereby generating a stacked structure with the passivation structure 720a. The milling and sawing steps produce the substrate 700a and the support structures 705b in truncated form as illustrated. In the view of FIG. 4D, the passivation structures 720a are formed around the edge of the substrate 600 and over the substrate 700a. The passivation structure 720a may also provide a desired protection provided by the passivation structure 710 as set forth above in connection with FIG. 4A.

Figures 5A, 5B:
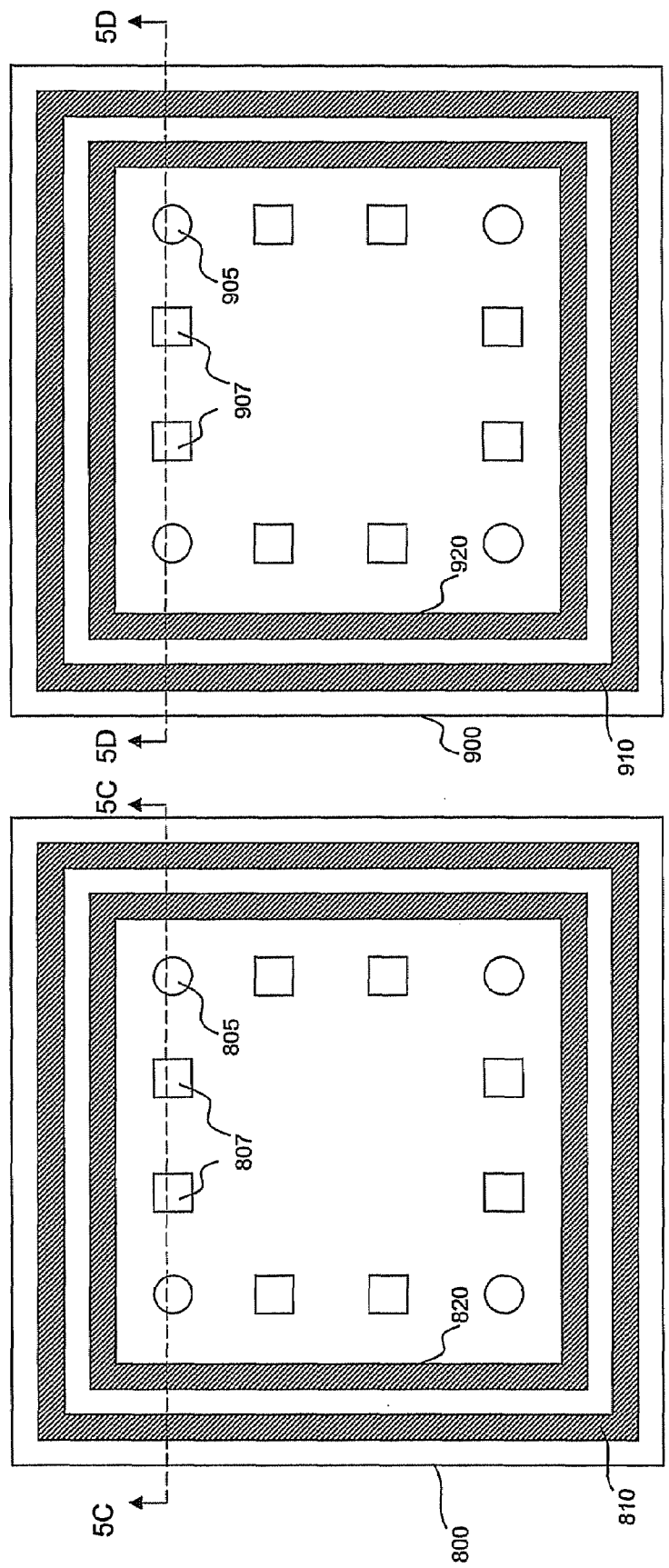
FIGS. 5A and 5B are schematic top views of substrates with exemplary protective structures.

FIGS. 5A and 5B are schematic top views of substrates with exemplary protective structures.

Referring to FIG. 5A, substrate 800, support structures 805 and pad structures 807 are similar to the substrate 500, support structures 505 and pad structures 507 set forth above in connection with FIG. 3A. The substrate 800 may comprise at least one protective structure, e.g. protective structures 810 and 820. The protective structures 810 and 820 may comprise at least one dielectric layer, e.g., oxide layer, nitride layer, oxide nitride layer, or similar, or combinations thereof and/or at least one conductive layer, e.g., Cu, AlCu, Al, W, Pt, Pb, or other suitable similar materials, or combinations thereof. The protective structures 810 and 820 may be formed around the pad structures 807 and the support structures 805. In some exemplary embodiments, the protective structures 810 and 820 may be formed by the same processing procedure of forming the pad structures 807.

The structure shown in FIG. 5B is intended to be similar or identical to the structure shown in FIG. 5A. The substrate 900, pad structures 907, support structures 905 and protective structures 910, 920 are the same as, or similar to, the substrate 800, pad structure 807, support structures 805 and protective structures 810, 820, respectively. Detailed descriptions are not repeated.

Figure 5C:
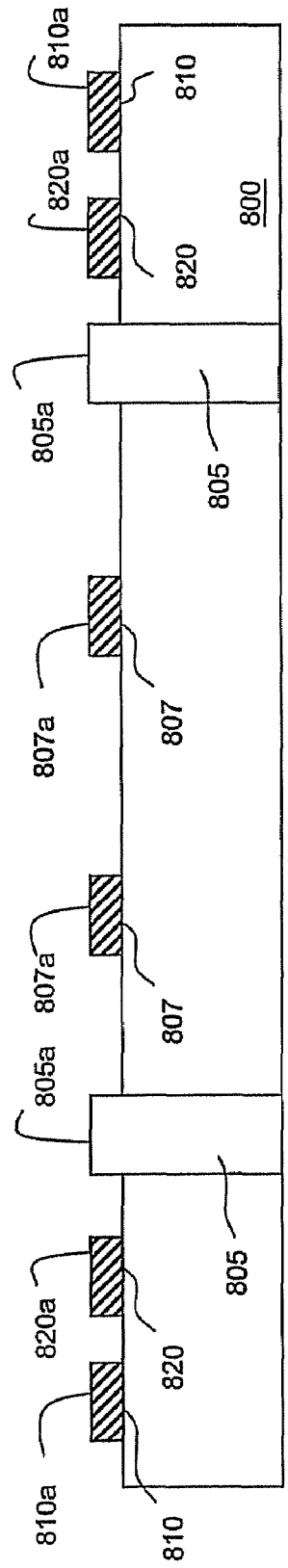
FIGS. 5C and 5D are schematic cross-sectional views of the substrates shown in FIGS. 5A and 5B taken along section lines 5C-5C and 5D-5D, respectively.
Figure 5D:
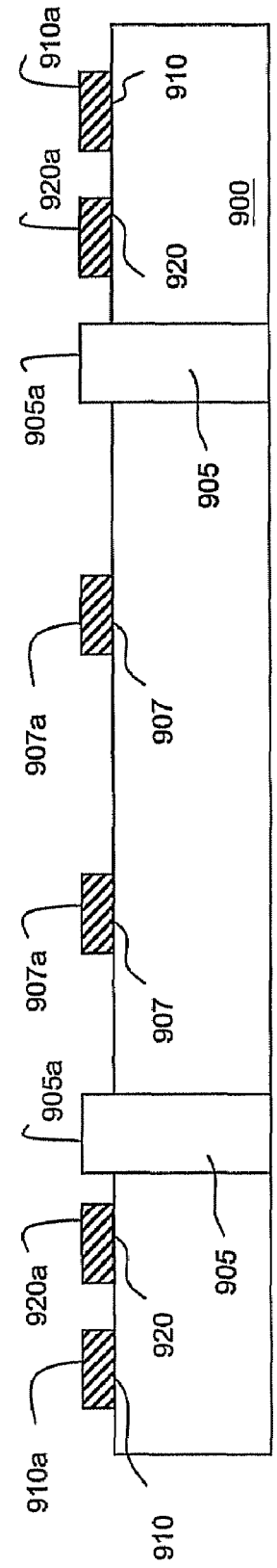
Figure 5E:
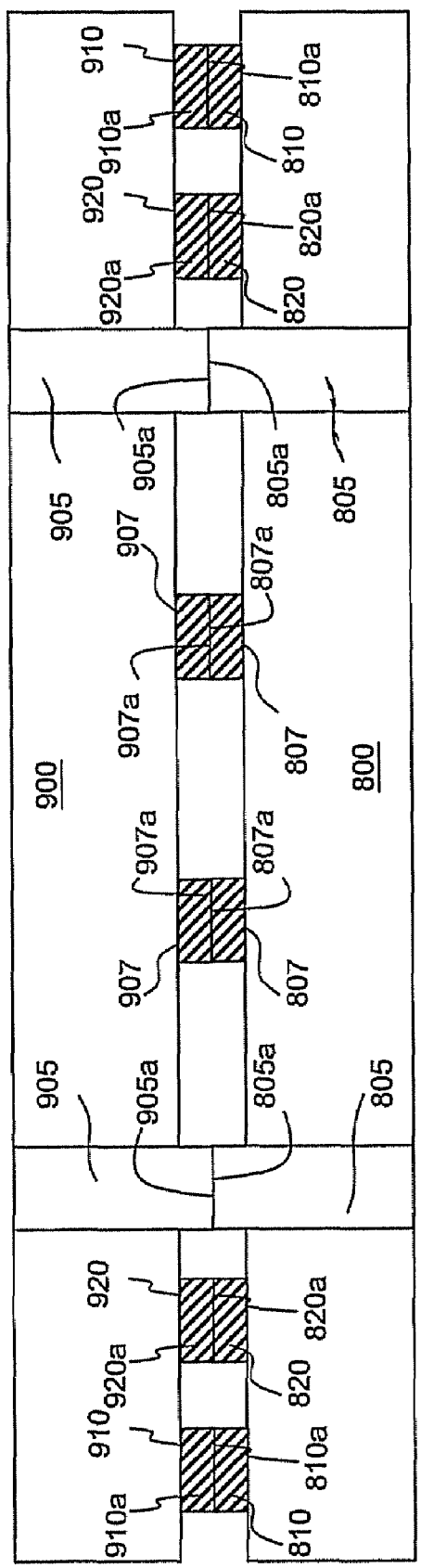
FIG. 5E is a schematic cross-sectional view showing a stacked structure of the substrates provided from FIGS. 5C and 5D.

FIGS. 5C and 5D are schematic cross-sectional views of the substrates 800 and 900 shown in FIGS. 5A and 5B taken along section lines 5C-5C and 5D-5D, respectively. FIG. 5E is a schematic cross-sectional view showing a stacked structure of the substrates 800 and 900 provided from FIGS. 5C and 5D.

Referring to FIG. 5E, the substrate 900 is flip bonded to the substrate 800. By the bonding step, the surfaces 805a, 807a, 810a, 820a contact surfaces 905a, 907a, 910a, 920a, respectively. The bonding step may be the same as, or similar to, the bonding step set forth above in connection with FIG. 2G. As shown in FIGS. 5A and 5B, the protective structures 810, 820 and 910, 920 are formed over the substrates 800, 900 and around the support structures 805, 905 and the pad structures 807 and 907, respectively. Accordingly, the bonded protective structures 810, 910 and 820, 920 cooperating with the substrates 800, 900 seal the bonded pads 807, 907 and diodes, devices, transistors, circuits and the like formed within and/or over the substrates 800, 900 therein. Accordingly, the bonded protective structures 810, 910 and 820, 920 provides a desired protection to the bonded pads 807, 907 and diodes, devices, transistors, circuits and the like formed within and/or over the substrates 800, 900.

It is noted that the shapes and numbers of the protective structures are not limited to the structures illustrated in the figures. One of ordinary skill in the art can modify the exemplary embodiments to achieve a desired protection for other pad structures, diodes, devices, transistors, circuits and the like.

Figure 5F:
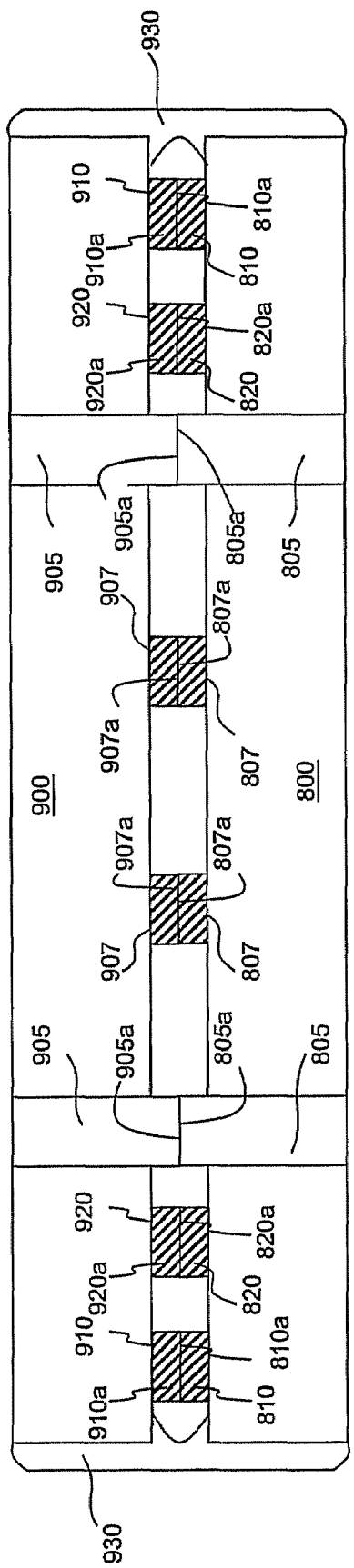
FIG. 5F is a schematic cross-sectional view showing another exemplary stacked structure with a protective structure and a passivation structure.

FIG. 5F is a schematic cross-sectional view showing another exemplary stacked structure with a protective structure and a passivation structure.

After the formation of the structure shown in FIG. 5E, a passivation structure 930 may be formed around the edge of the stacked structure. The passivation structure 930 may be the same as, or similar to, the passivation structure 710 shown in FIG. 4A. In some embodiments, the passivation structures 720a and methods of forming the passivation structures 720a described above in connection with FIGS. 4B-4D can be applied for forming the passivation structure 930.

Figure 6B:
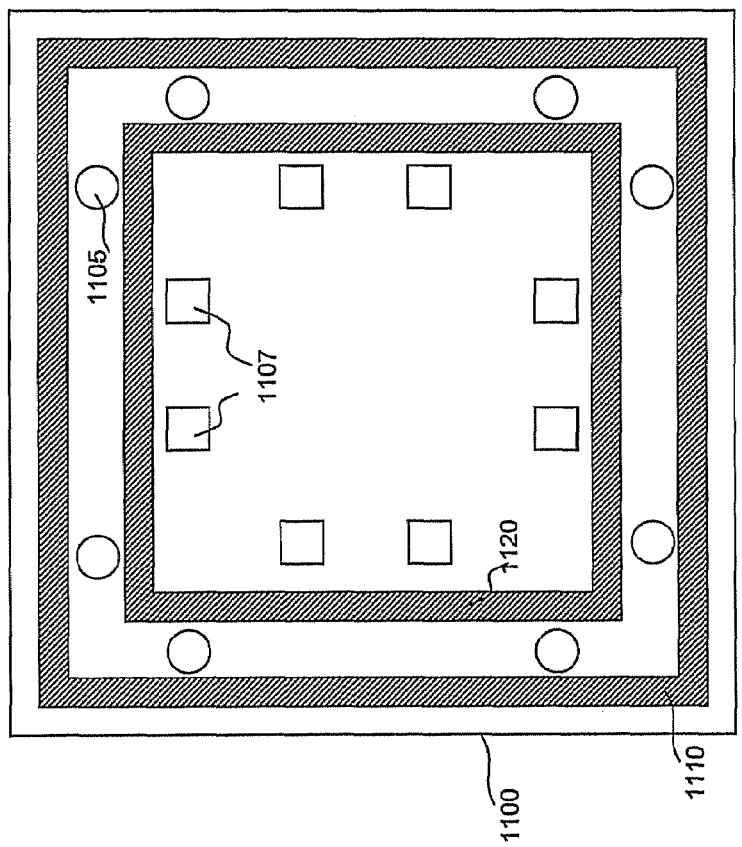
FIGS. 6A and 6B are schematic cross-sectional views showing top views of exemplary substrates.
Figure 6A:
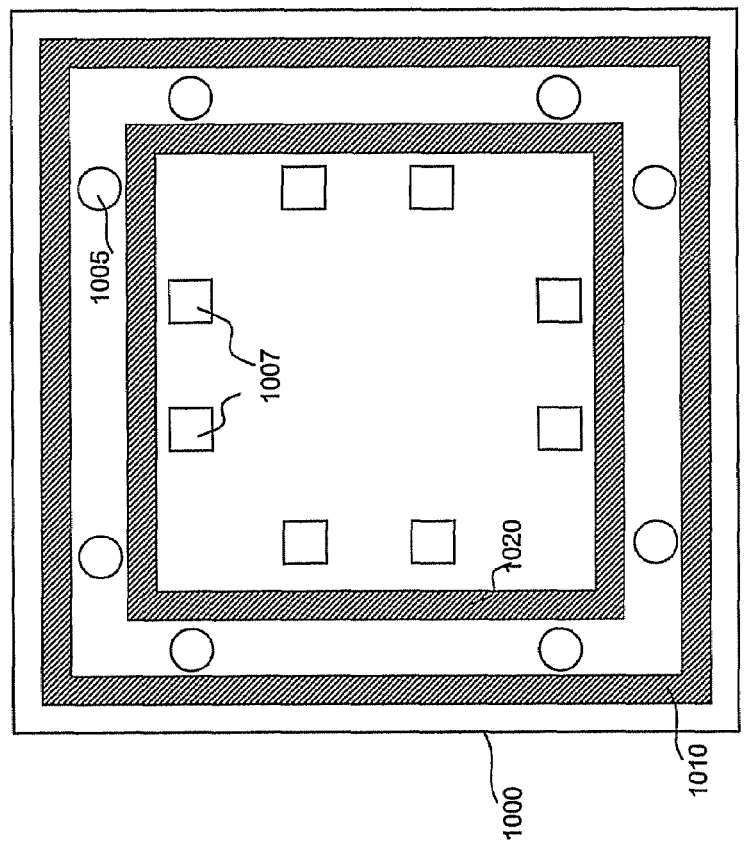
Figure 6C:
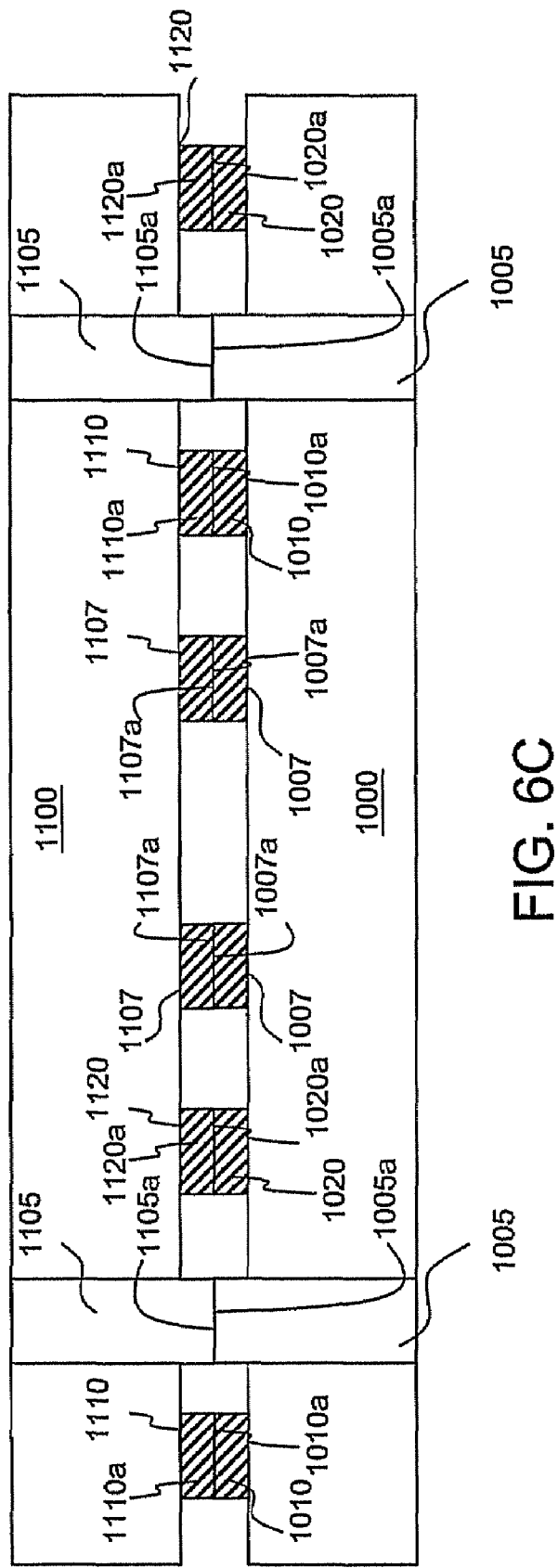
FIG. 6C is a schematic cross-sectional view showing a stacked structure of the substrates provided from FIGS. 6A and 6B.

FIGS. 6A and 6B are schematic cross-sectional views showing top views of exemplary substrates. FIG. 6C is a schematic cross-sectional view showing a stacked structure of the substrates provided in FIGS. 6A and 6B.

Substrates 1000, 1100 shown in FIGS. 6A and 6B, respectively, are generally similar to the substrates 800, 900 shown in FIGS. 5A and 5B, respectively. Pad structures 1007, 1107 and support structures 1005, 1105 may be similar or substantially identical to the previously described pad structures 807, 907 and support structures 805, 905, respectively. According to the embodiment in which the structures shown in FIGS. 5E and 6C, each represent a die and are drawn to the same scale at least in the cross sectional direction, the stacked structure shown in FIG. 6C is smaller than the stacked structure shown in FIG. 5E. In other words, the stacked structure shown in FIG. 6C has a smaller die area, at least in the cross-sectional direction. As shown in FIG. 6C, the support structures 1005 and 1105 are formed between the protective structures 1010, 1020 and 1110, 1120, respectively. The non-used spaces (not labeled) between the protective structures 810, 820 and 910, 920 shown in FIGS. 5A-5B accommodate the formation of the support structures 1005 and 1105 in FIG. 6C.

Figure 7B:
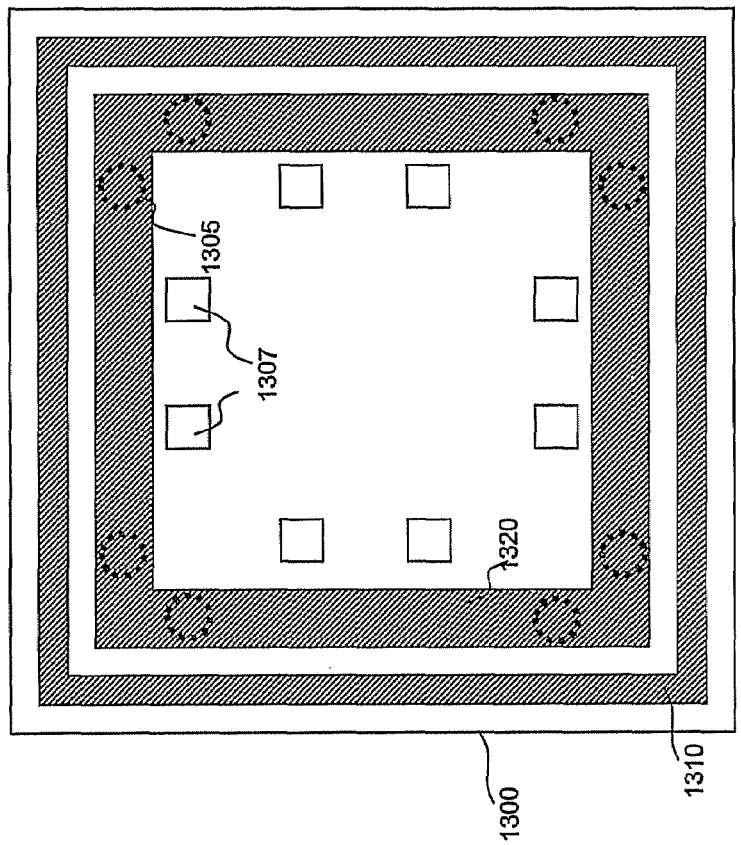
FIGS. 7A and 7B are schematic cross-sectional views showing top views of another exemplary substrates.
Figure 7A:
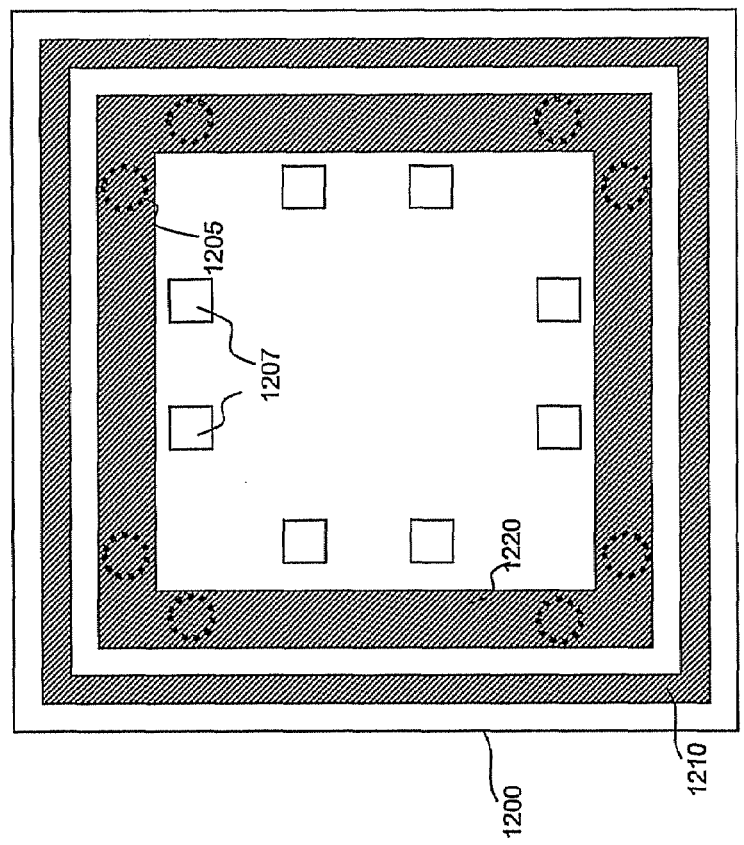
Figure 7C:
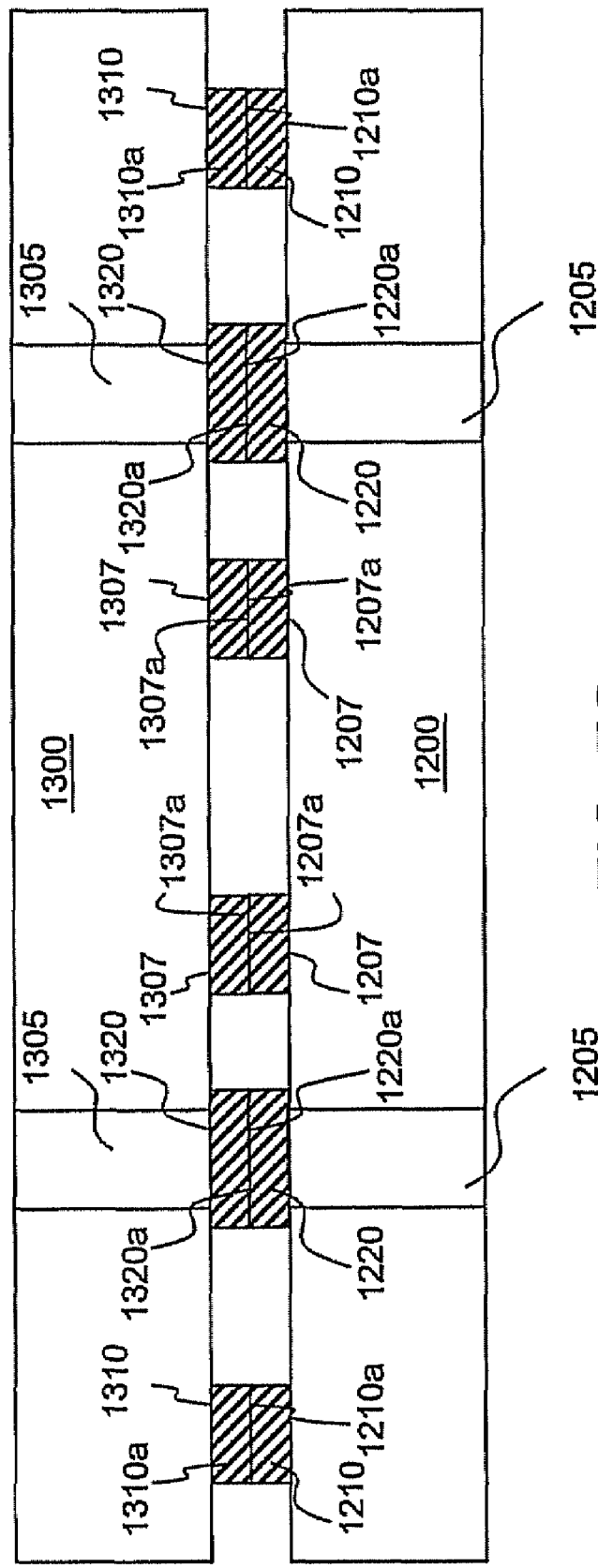
FIG. 7C is a schematic cross-sectional view showing a stacked structure of the substrates provided from FIGS. 7A and 7B.

FIGS. 7A and 7B are schematic cross-sectional views showing top views of further exemplary substrates. FIG. 7C is a schematic cross-sectional view showing a stacked structure formed of the substrates illustrated in FIGS. 7A and 7B. support structures 1205, 1305 are formed through the first and second substrates 1200, 1300, contacting the protect structures 1220, 1320, respectively.

According to the embodiment in which the structures shown in FIGS. 5E and 7C, each represent a die and are drawn to the same scale at least in the cross sectional direction, the stacked structure shown in FIG. 7C is smaller than the stacked structure shown in FIG. 5E. In other words, the stacked structure shown in FIG. 7C has a smaller die area, at least in the cross-sectional direction. As shown in FIG. 7C, the support structures 1205 and 1305 are formed under the protective structures 1220, 1320, respectively. This stacked structure save spaces which accommodate the support structures 1205, 1305 or the protective structures 1220, 1320.

In still other exemplary embodiments, more support structures (not shown) may be formed and surrounded by the protective structures 1020, 1120, 1220 and 1320 to achieve a desired mechanical support for bonding substrates.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of forming a semiconductor device, comprising the steps of:
    forming at least one transistor gate over a first substrate and at least one first conductive structure within the first substrate;
    forming an interlayer dielectric (ILD) layer over the gate transistor, the ILD layer comprising at least one contact structure formed therein and making electrical contact with the transistor gate and at least one second conductive structure and making electric contact with the first conductive structure;
    forming a first passivation layer over the ILD layer, the first passivation layer comprising at least one first pad structure formed therein, wherein the first pad structure makes electrical contact with the second conductive structure;
    bonding the first substrate with a second substrate;
    removing at least a portion of the first conductive structure; and
    forming a second passivation layer over a bottom surface of the first substrate, the second passivation layer comprising at least one second pad structure formed therein, wherein the second pad structure makes electrical contact with the first conductive structure.

2. The method of claim 1, further comprising:
    thinning the bottom surface of the first substrate to expose at least one dummy structure disposed within the first substrate; and
    removing a portion of the at least one dummy structure from the first substrate to provide an opening within the first substrate and to expose a surface of the at least one first conductive structure.

3. The method of claim 2, further comprising:
    filling the opening within the first substrate with a conductive material.

4. The method of claim 1, further comprising:
    thinning the first substrate to expose at least one dummy structure disposed within the first substrate;
    removing the dummy structure from the first substrate to provide an opening having sidewalls;
    forming a dielectric liner on the sidewalls of the opening; and
    filling the opening within the first substrate with a conductive material.

5. The method of claim 1, further comprising bonding a third substrate to the first substrate.

6. The method of claim 1, further comprising:
    forming at least one opening in the first substrate; and
    depositing a dielectric material within the at least one opening to create a dummy structure; and
    removing a portion of the dummy structure such that an upper surface of the dummy structure is substantially planar with an upper surface of the first substrate.

7. A method, comprising:
    forming a dummy structure in a first substrate;
    forming a transistor gate over a first surface of the first substrate;
    forming an interlayer dielectric (ILD) layer over a surface of the transistor gate and the dummy structure, the ILD layer including a contact structure formed therein, the contact structure coupled to the transistor gate;
    forming a first conductive structure in the interlayer dielectric, the first conductive structure coupled to the contact structure;
    forming a first passivation layer over an intermetal dielectric (IMD) layer formed over the ILD layer, the passivation layer including a conductive pad coupled to the first conductive structure in the ILD layer;
    bonding a second substrate to the first substrate;
    removing a portion of the dummy structure in the first substrate to expose a surface of the first conductive structure;
    filling an opening created by the removal of the portion of the dummy structure with a conductive material; and
    forming a second passivation layer over the second surface of the first substrate, the second passivation layer including a second pad structure formed therein, the second pad structure making electrical contact with the first conductive structure through the conductive material.

8. The method of claim 7, further comprising thinning the first substrate prior to removing the portion of the dummy structure.

9. The method of claim 7, wherein the dummy structure is completely removed from the first substrate, the method further comprising covering a sidewall of the opening created by the removal of the dummy structure with a dielectric material prior to filling the opening with the conductive material.

10. The method of claim 7, wherein the second pad structure is directly disposed over the conductive material disposed in the opening created by the removal of the portion of the dummy structure, the method further comprising bonding a third substrate to the first substrate.

11. A method, comprising:
    forming an interlayer dielectric (ILD) layer over a gate of a transistor formed over a first surface of a first substrate, the ILD layer including a first conductive structure formed therein that makes electrical contact with the transistor gate and a first contact structure disposed within the ILD layer;
    forming a first passivation layer over the ILD layer, the first passivation layer including a first pad structure formed therein, the first pad structure making electrical contact with the first conductive structure;
    bonding the first substrate with a second substrate;
    thinning the first substrate; and
    forming a second passivation layer over a second surface of the first substrate, the second passivation layer including a second pad structure formed therein, the second pad structure making electrical contact with the first conductive structure.

12. The method of claim 11, further comprising:
    forming a first opening in the first substrate;
    depositing a dielectric material within the first opening to create a dummy structure; and
    removing a first portion of the dummy structure such that an upper surface of the dummy structure is substantially planar with the first surface of the first substrate.

13. The method of claim 12, further comprising:
    removing the dummy structure from the first substrate to create a second opening and to expose a surface of the first conductive structure; and
    filling the second opening with a conductive material, the conductive material contacting the first conductive structure and providing the electrical contact to the second pad structure.

14. The method of claim 13, further comprising bonding a third substrate to the second surface of the first substrate.

15. The method of claim 14, wherein the third substrate includes a third pad structure electrically connected to the second pad structure.

16. The method of claim 12, further comprising:
   removing a second portion of the dummy structure to create a second opening having sidewalls and to expose a surface of the first conductive structure;
   forming a dielectric material over the sidewalls of the second opening; and
   filling a remainder of the second opening with a conductive material, the conductive material contacting the first conductive structure and providing the electrical contact to the second pad structure.

17. The method of claim 16, further comprising bonding a third substrate to the second surface of the first substrate.

18. The method of claim 17, wherein the third substrate includes a third pad structure electrically connected to the second pad structure.

19. The method of claim 11, further comprising:
   forming an intermetal dielectric (IMD) layer over a surface of the ILD layer before the first passivation layer is formed over the IMD layer, the IMD layer including at least one metal containing structure to electrically connect the first conductive structure in the ILD layer to the first pad structure in the first passivation layer.

20. The method of claim 19, wherein the IMD layer includes a plurality of dielectric and metal containing layers.

* * * * *